(12) United States Patent
Inukai

(10) Patent No.: US 7,102,161 B2
(45) Date of Patent: Sep. 5, 2006

(54) SWITCHING ELEMENT, DISPLAY DEVICE USING THE SWITCHING ELEMENT, AND LIGHT EMITTING DEVICE

(75) Inventor: Kazutaka Inukai, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 247 days.

(21) Appl. No.: 10/266,867

(22) Filed: Oct. 9, 2002

(65) Prior Publication Data
US 2003/0066740 A1 Apr. 10, 2003

(30) Foreign Application Priority Data
Oct. 9, 2001 (JP) ........................... 2001-311989

(51) Int. Cl.
*H01L 29/04* (2006.01)

(52) U.S. Cl. ..................... 257/59; 257/72; 257/401; 257/408; 257/347

(58) Field of Classification Search ............... 257/59, 257/72, 401, 408, 347, 365, 40, 368, 79
See application file for complete search history.

(56) References Cited

U.S. PATENT DOCUMENTS

| 4,219,828 A | | 8/1980 | Lardy et al. | |
|---|---|---|---|---|
| 4,917,467 A | | 4/1990 | Chen et al. | |
| 5,198,379 A | * | 3/1993 | Adan | ............... 438/151 |
| 5,258,325 A | | 11/1993 | Spitzer et al. | |
| 5,331,192 A | * | 7/1994 | Kudoh | ............... 257/368 |

(Continued)

FOREIGN PATENT DOCUMENTS

| EP | 1 094 436 A2 | 4/2001 |
|---|---|---|
| EP | 1 102 234 A2 | 5/2001 |
| EP | 1 103 946 A2 | 5/2001 |
| JP | 60-241266 | 11/1985 |
| JP | 04-092475 | 3/1992 |

(Continued)

OTHER PUBLICATIONS

Tsutsui et al., "Electroluminescence in Organic Thin Films", Photochemical Processes in Organized Molecular Systems, 1991, pp. 437–450 (Elsevier Science Publishers, Tokyo, 1991).

M. A. Baldo et al., "Highly Efficient Phosphorescent Emission from Organic Electroluminescent Device", Nature vol. 395, Sep. 10, 1998, pp. 151–154.

M. A. Baldo et al., "Very High–Efficiency Green Organic Light–Emitting Devices Based on Electrophosphorescence", Applied Physics Letters vol. 74, No. Jul. 5, 1999, pp. 4–6.

Tsutsui et al., "High Quantum Efficiency in Organic Light–Emitting Devices with Iridium–Comolex as a Triplet Emissive Center", Japanese Journal of Applied Physics vol. 38, Part 12B, Dec. 15, 1999, pp. L1502–L1504.

*Primary Examiner*—Mark V. Prenty
(74) *Attorney, Agent, or Firm*—Nixon Peabody LLP; Jeffrey L. Costellia

(57) ABSTRACT

A switching element is provided, which is capable of short-circuiting or opening three or more nodes simultaneously, and in which the surface area occupied on a substrate can be reduced. The switching element of the present invention has an active layer, an insulating film contacting the active layer, a gate electrode contacting the insulating film, and three or more connection electrodes. The active layer has at least one channel forming region and three or more impurity doped regions, and the connection electrodes are each connected to a different impurity region. An impurity region contacting an arbitrary connection electrode contacts only one of the channel forming regions.

2 Claims, 15 Drawing Sheets

U.S. PATENT DOCUMENTS

| | | |
|---|---|---|
| 5,637,899 A | 6/1997 | Eimori et al. |
| 5,986,306 A * | 11/1999 | Nakajima et al. ........... 257/353 |
| 6,020,598 A | 2/2000 | Yamazaki |
| 6,246,180 B1 | 6/2001 | Nishigaki |
| 6,501,466 B1 | 12/2002 | Yamagishi et al. |
| 6,583,775 B1 | 6/2003 | Sekiya et al. |
| 2002/0047581 A1 | 4/2002 | Koyama |
| 2002/0047852 A1 | 4/2002 | Inukai et al. |
| 2002/0086180 A1 | 7/2002 | Seo et al. |
| 2002/0113546 A1 | 8/2002 | Seo et al. |
| 2002/0121860 A1 | 9/2002 | Seo et al. |
| 2002/0139303 A1 | 10/2002 | Yamazaki et al. |
| 2003/0015960 A1 | 1/2003 | Seo et al. |
| 2003/0066740 A1 * | 4/2003 | Inukai ...................... 200/11 D |
| 2003/0089910 A1 | 5/2003 | Inukai |
| 2003/0122140 A1 | 7/2003 | Yamazaki et al. |
| 2003/0184505 A1 | 10/2003 | Inukai et al. |
| 2004/0012026 A1 | 1/2004 | Seo et al. |
| 2004/0056257 A1 | 3/2004 | Sakamoto et al. |

FOREIGN PATENT DOCUMENTS

| | | |
|---|---|---|
| JP | 04-267551 | 9/1992 |
| JP | 07-504782 | 5/1995 |
| JP | 09-319323 | 12/1997 |
| JP | 2000-235370 | 8/2000 |
| JP | 2000-347621 | 12/2000 |
| JP | 2001-147659 | 5/2001 |
| JP | 2001-222255 | 8/2001 |
| JP | 2001-343933 | 12/2001 |
| JP | 2002-149113 | 5/2002 |
| JP | 2004-004348 | 1/2004 |
| WO | WO 1993/016491 | 8/1993 |

* cited by examiner

F I G. 10
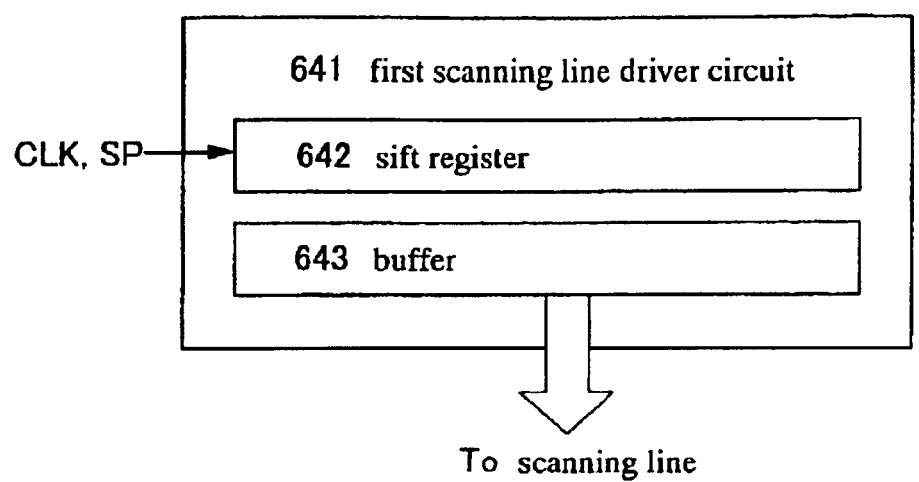

Prior Art

SWITCHING ELEMENT, DISPLAY DEVICE USING THE SWITCHING ELEMENT, AND LIGHT EMITTING DEVICE

BACKGROUND OF THE INVENTION

1. Field of the Invention

The present invention relates to a semiconductor device formed by using a semiconductor film, which includes a switching element. Also, the present invention relates to an OLED panel in which the switching element and an organic light emitting diode (OLED) formed on a substrate is enclosed between the substrate and a cover member. Also, the present invention relates to an OLED module in which an IC is mounted on the OLED panel. Note that, in this specification, the OLED panel and the OLED module are generically called light emitting devices.

2. Description of the Related Art

In recent years, technology for forming a thin film transistor (hereafter referred as TFT) on a substrate has been largely improved, and an application development of the TFT to an active matrix type display device has been carried out. In the active matrix type display device, a TFT as a switching element is provided in each pixel and video signals are sequentially written in each pixel to display an image. A TFT is an indispensable element in realizing the active matrix type display device.

The TFT also becomes a switching element, which has three terminals of a source electrode, a drain electrode, and a gate electrode. An electric resistance between the source electrode and the gate electrode is controlled by the voltage, which is applied to the gate electrode.

With the increasing needs for rapid increases in display quality and amount of display information, and for making displays lighter and thinner, the demand for higher definition pixels in active matrix display devices is rising. Further, higher functionality such as incorporating memory into pixels is also being sought after more and more.

However, even if pixels are given higher definition higher functionality, there is a limitation in how much the size of TFTs formed in each pixel can be shrunk when considering how to ensure the amount of on electric current, the resistance to voltage, and the like.

However, for cases in which the proportion of the pixel surface area occupied by the TFTs cannot be reduced, the surface area through which light passes becomes smaller in pixels of a liquid crystal display device, and the brightness as seen by eye becomes lower. Further, even in light emitting devices, light from an OLED is blocked by TFTs when the light emitted by the OLED is irradiated to the TFT side, and the brightness as seen by eye becomes lower.

It is therefore preferable to reduce the number of TFTs formed in each pixel, and the surface area of the TFTs, by as much as possible.

However, provided that the circuit structure of each pixel has been determined, it is normally not possible to simply reduce the number of TFTs. For example, it is necessary to short-circuit or to open three nodes A, B, and C at the same in each of the pixels as shown in FIG. 15A, and therefore at least two TFTs 3001 and 3002 must be formed if three-terminal switching element TFTs are used. The number of TFTs cannot be reduced any further.

In particular, the number of TFTs formed in each pixel is generally large, their connections are complex, and it is difficult to suppress the number of TFTs for the case of active matrix light emitting devices as compared with liquid crystal display devices in which there is no need for anything other than simple write-in switching of voltage signals.

SUMMARY OF THE INVENTION

In view of the aforementioned problems, an object of the present invention is to provide a switching element in which three or more nodes can be short-circuited or opened at the same time, and in which the surface area of a substrate occupied by the switching element can be suppressed. Further, an object of the present invention is to provide an active matrix display device using the switching element.

Further, a drop in OLED brightness following degradation in an organic light emitting material is a problem in the practical use of light emitting devices. Note that OLEDs have a layer (hereinafter referred to as an organic light emitting layer) containing an organic compound (organic light emitting material) in which electroluminescence that is generated by the addition of an electric field can be obtained, an anode layer, and a cathode layer. Light emission when returning to a base state from a singlet excitation state (fluorescence), and light emission when returning to a base state from a triplet excitation state (phosphorescence) exist as types of luminescence in organic compounds, and a light emitting device of the present invention may use any one of the aforementioned types of light emission, and may also use both types of light emission.

All layers formed between an anode and a cathode of an OLED are defined as organic light emitting layers in this specification. Specifically, the organic light emitting layer includes light emitting layers, hole injecting layers, electron injecting layers, hole transporting layers, electron transporting layers, and the like. There are also cases in which inorganic compounds are contained within these layers. Basically, the OLED has a structure in which an anode, a light emitting layer, and a cathode are laminated in order. In addition to this structure, there are also cases where the OLED has another structure, such as one having an anode, a hole injecting layer, a light emitting layer, or a cathode laminated in order, and one having an anode, a hole injecting layer, a light emitting layer, an electron transporting layer, and a cathode laminated in order.

Organic light emitting materials are weak with respect to moisture, oxygen, light, and heat, and deterioration proceeds due to these causes. Specifically, the speed of deterioration varies due to factors such as the device structure used for driving the light emitting device, organic light emitting material characteristics, electrode materials, process step conditions, and method of driving the light emitting device.

Even if a voltage applied to the organic light emitting layer is constant, the brightness of the OLED is reduced to cause a displayed image to be unclear if the organic light emitting layer deteriorates.

Further, for cases of displaying a color image by using three types of OLEDs corresponding to the colors R (red), G (green), and B (blue), the organic light emitting materials structuring the organic light emitting layers differ by color corresponding to the OLEDs. The OLED organic light emitting layers therefore deteriorate at different speeds according to their corresponding colors. In this case, the brightness of the OLEDs differs by color as times passes, and display of a desired color in the light emitting device cannot be performed.

Further, the temperature of the organic light emitting layer is influenced by atmospheric temperature, heat emitted by the OLED panel itself, and the like, and in general, the value of the electric current flowing an OLED changes in accordance with temperature. Even if the voltage is fixed, the amount of electric current flowing in the OLED will become larger if the temperature of the organic light emitting layer increases. There is a proportional relationship between the amount of electric current flowing in the OLED and the OLED brightness, and therefore the higher the value of the electric current flowing in the OLED, the higher the OLED brightness becomes. The OLED brightness thus changes due to the temperature of the organic light emitting layer, and therefore it is difficult to display a desired gray scale. Furthermore, the amount of electric current consumed by the light emitting device increases with increasing temperature.

In addition, the degree of change in the flowing electric current caused by temperature changes generally differs by the type of organic light emitting material in use, and therefore it is possible that the brightness of each OLED color in a color display will change in an inconsistent manner in accordance with temperature. If the balance between the brightness of each color is lost, then a desired color cannot be displayed.

In view of the aforementioned problems, another object of the present invention is to provide a light emitting device capable of obtaining constant brightness that is not influenced by deterioration of an organic light emitting layer or changes in temperature, and in addition, is capable of performing display of a desired color.

The present invention is related to a switching element having a novel structure having at least four terminals, which is capable of short-circuiting or opening three or more nodes simultaneously, and a light emitting device using the switching element.

Specifically, the switching element has an active layer, an insulating film contacting the active layer, a gate electrode contacting the insulating film, and three or more electrodes (hereafter referred to as connection electrodes in this specification). The active layer has at least one channel forming region, and three or more impurity doped regions, and each of the connection electrodes contacts one different impurity region.

An impurity region contacting an arbitrary connection electrode contacts only one channel forming region. Note that a low concentration impurity region may also be sandwiched between the impurity region contacting an arbitrary connection electrode and one channel forming region. In other words, arbitrary two impurity regions contacting a connection electrode do not sandwich an impurity region contacting another connection electrode.

The gate electrode overlaps with the channel forming region, sandwiching the insulating film. The resistance between each of the connection electrodes can be controlled, and all of the connection electrodes can be short-circuited or opened simultaneously, by controlling a voltage applied to the gate electrode.

Note that the gate electrode may be formed between a substrate and the active layer, and the active layer may also be formed between the gate electrode and the substrate, in the switching element of the present invention.

Thus, by using the switching element, the surface area occupied by the pixels can be suppressed more than by structuring the switching circuit by using a plurality of TFTs, and high definition and high functionality can be achieved while maintaining the aperture ratio of the pixels.

Further, considering light emission while maintaining a fixed voltage applied to the OLEDs and light emission while maintaining a fixed electric current flowing in the OLEDs, the latter can generally lower the degree of reduction in brightness due to OLED deterioration. Note that, in this specification, the electric current flowing in the OLEDs is referred to as OLED electric current, and the voltage applied to the OLEDs is referred to as OLED voltage. That is, the change in the brightness of light emitted form the OLEDs due to OLED deterioration can be suppressed by controlling the electric current flowing in the OLEDs, not by controlling the brightness of the OLEDs with voltage.

The switching element of the present invention is formed in each pixel, it is preferable that a transistor drain current Id which controls the electric current flowing in the OLEDs be controlled in a signal line driver circuit when the switching element is on.

A voltage develops between a gate electrode and a source electrode of the transistor for controlling the electric current flowing in the OLEDs when the drain current Id is made to flow. The voltage is maintained as is, and the transistor drain current is made to flow in the OLEDs through a single circuit element or a plurality of circuit elements. Note that the transistor for controlling the electric current flowing in the OLEDs is driven in the saturation region.

The value of the electric current flowing in the OLEDs is controlled by the signal line driver circuit in the above structure. It therefore becomes possible to control the electric current flowing in the OLEDs to a desired value without being influenced by differences in the characteristics of the transistors which control the electric current flowing in the OLEDs, deterioration of the OLEDs, or the like.

By using the switching element to be structured as stated above, the present invention can suppress reductions in the brightness of the OLEDs even if the organic light emitting layers deteriorate, and as a result, a clear image can be displayed. Further, even if the OLED organic light emitting layers deteriorate at different speeds by color for color display light emitting devices using OLEDs corresponding to different colors, display of a desired color can be performed by preventing the balance in brightness for each color from being lost.

The OLED electric current can be controlled to a desired value even if the temperature of the organic light emitting layer is influenced by atmospheric temperature, heat generated by the OLED panel itself, and the like. The OLED electric current and the OLED brightness are therefore proportional, and consequently changes in the OLED brightness can be suppressed, and increases in electric current consumption that follow increases in temperature can be prevented. Furthermore, changes in OLED brightness for each color for color display light emitting devices can be suppressed without being influenced by temperature changes, and therefore the balance in brightness for each color can be prevented from being lost, and a desired color can be displayed.

In addition, the degree to which the OLED electric current changes due to changes in temperature generally differs by the type of the organic light emitting material in use, and therefore it is possible that the brightness of each OLED color in a color display will change in an inconsistent manner in accordance with temperature. However, a desired brightness can be obtained by the light emitting device of the present invention without being influenced by temperature changes, and therefore the balance between the brightness of each color can be prevented from being lost, and the desired color can be displayed.

Further, wirings for supplying electric current to the OLEDs generally have resistance in light emitting devices, and therefore the electric potential drops somewhat due to the length of the wirings. The drop in the electric potential also differs greatly in accordance with the image being displayed. In particular, if the proportion of pixels having a high gray scale number becomes high in a plurality of pixels to which electric current is supplied by the same wiring, then the amount of electric current flowing in the wiring becomes large, and a reduction in electric potential is caused to a remarkable degree. If the electric potential drops, the voltage applied to the OLEDs of each pixel also drops, and therefore the electric current supplied to each pixel becomes smaller. Consequently, if a fixed gray scale is displayed in certain predetermined pixels, and if the gray scale number changes in other pixels supplied with electric current by the same wiring, then the electric current supplied to the predetermined pixels changes accordingly, and the gray scale number also changes as a result. With the present invention, however, a desired value of the electric current flowing in each OLED can be maintained, and therefore gray scale changes caused by a drop in electric potential due to the wiring resistance can be prevented.

Further, by using the switching element of the present invention, the proportion of the surface area in each pixel occupied by the transistors can be suppressed.

Note that the transistors used in the pixels may be transistors formed by using polycrystalline silicon, and may also be thin film transistors formed by using amorphous silicon, in the light emitting device of the present invention. Furthermore, transistors which use organic semiconductors may also be used.

Note that the transistors formed in the pixels of the light emitting device of the present invention may have a single gate structure, a double gate structure, or a multi-gate structure having more than two gate electrodes.

BRIEF DESCRIPTION OF THE DRAWINGS

In the accompanying drawings:

FIG. 10 is a block diagram of a scanning line driver circuit;

DETAILED DESCRIPTION OF THE PREFERRED EMBODIMENTS

Embodiment Mode 1

Figure 1A:
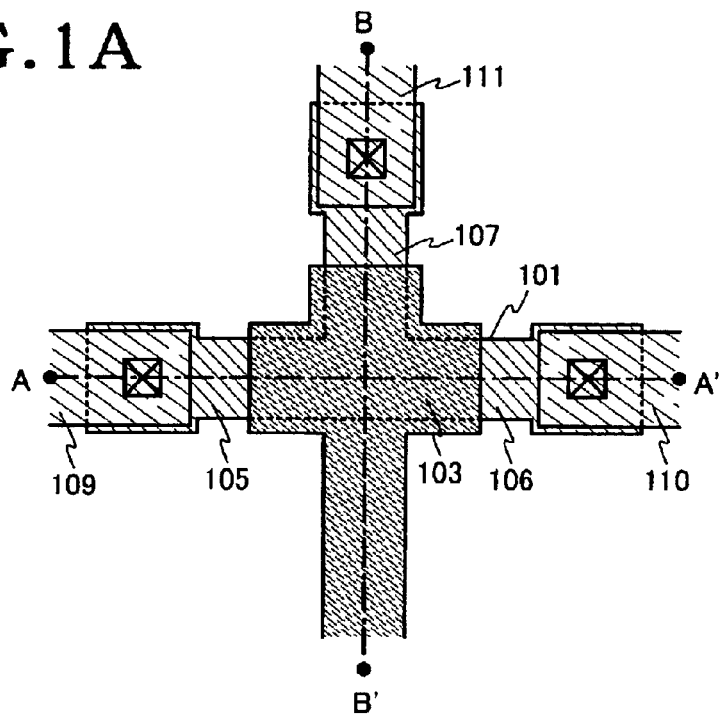
FIGS. 1A to 1C are diagrams showing the structure of a transistor of the present invention.
Figure 1B:
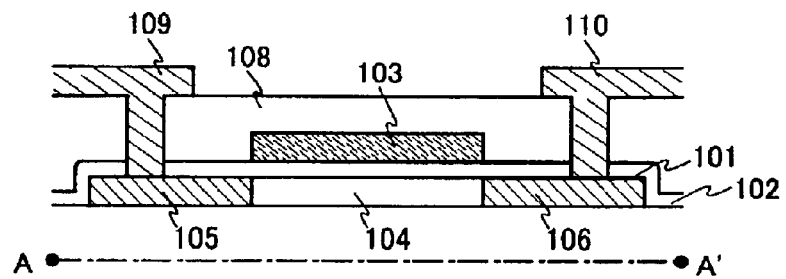
Figure 1C:
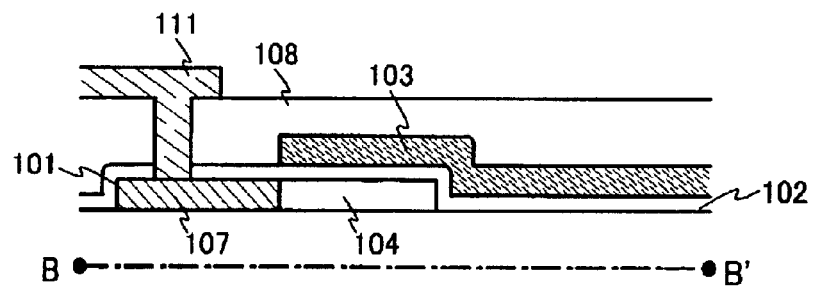

A structure of a switching element of the present invention is explained using FIGS. 1A to 1C. FIG. 1A is an upper surface diagram of a transistor of the present invention, FIG. 1B corresponds to a cross sectional diagram taken along a broken line segment A–A' of FIG. 1A, and FIG. 1C corresponds to a cross sectional diagram taken along a broken line segment B–B' of FIG. 1A.

The transistor of the present invention has an active layer 101, a gate insulating film 102 contacting the active layer 101, and gate electrode 103 contacting the gate insulating film 102. The active layer 101 has a channel forming region 104 and impurity regions 105, 106 and 107 to which an impurity that imparts conductivity has been added. The gate electrode 103 and the channel forming region 104 overlap with each other while sandwiching the gate insulating film therebetween.

The impurity regions 105, 106, and 107 are connected to the channel forming region 104, respectively. Note that although all of the impurity regions are connected to the channel forming region 104 in Embodiment Mode 1, the present invention is not limited to this structure. Low concentration impurity regions (LDD regions) having a lower impurity concentration than the impurity regions may also be formed between the impurity regions and the channel forming regions, and regions that do not overlap with the gate electrode and to which an impurity is not added (offset regions) may also be formed.

An insulating film 108 is formed on the gate insulating film 102 so as to cover the impurity regions 105, 106, and 107 of the active layer 101. Connection wirings 109, 110, and 111 for connecting to the impurity regions 105, 106, and 107, respectively, are then formed through contact holes formed in the insulating film 108 and in the gate insulating film 102. Note that, although the gate insulating film 102 covers the impurity regions 105, 106, and 107 in FIGS. 1A to 1C, the present invention is not limited to the structure. It is not always necessary for the impurity regions 105, 106, and 107 to be covered by the gate insulating film 102. They may also be exposed.

The switching element shown in FIGS. 1A to 1C has the resistance between each of the connection wirings 109, 110, and 111 controlled by a voltage applied to the gate electrode 103.

Three nodes, specifically the connection wirings 109, 110, and 111 can be connected simultaneously with the transistor of FIGS. 1A to 1C. Note that, unless otherwise specified, in this specification, the term connection indicates electrical connection.

The surface area occupied by the transistors and the like added to the switching element can be suppressed, and the pixels can be given higher definition and higher functionality without lowering the pixel aperture ratio, in accordance with the aforementioned structure. On the other hand, it is necessary to use two or more transistors for cases of controlling the connection of three nodes by using TFTs.

Embodiment Mode 2

Figure 2:
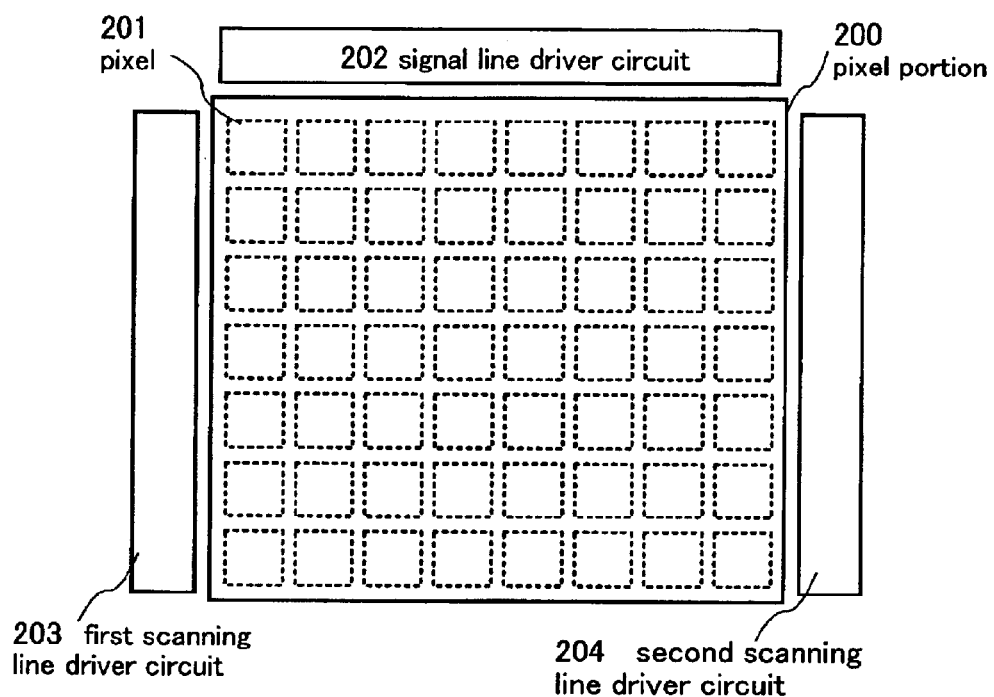
FIG. 2 is a block diagram of a light emitting device of the present invention.

A block diagram of the structure of an OLED panel of the present invention is shown in FIG. 2. Reference numeral 200 denotes a pixel portion, and a plurality of pixels 201 are formed in a matrix shape. Further, reference numeral 202 denotes a signal line driver circuit, reference numeral 203 denotes a first scanning line driver circuit, and reference numeral 204 denotes a second scanning line driver circuit.

Note that, although the signal line driver circuit 202, the first scanning line driver circuit 203, and the second scanning line drive circuit 204 are formed on the same substrate as the pixel portion 200 in FIG. 2, the present invention is not limited to this structure. The signal line driver circuit 202, the first scanning line driver circuit 203, and the second scanning line driver circuit 204 may also be formed on a substrate differing from that of the pixel portion 200, and connected to the pixel portion 200 through a connector such as an FPC. Further, although each of the signal line driver circuit 202, the first scanning line driver circuit 203, and the second scanning line driver circuit 204 are formed in FIG. 2, the present invention is not limited to this structure. The numbers of the signal line driver circuits 202, the first scanning line driver circuits 203, and the second scanning line driver circuits 204 used can be arbitrarily set by a designer.

Further, although not shown by FIG. 2, the signal lines S1 to Sx, electric power source lines V1 to Vx, first scanning lines G1 to Gy, and second scanning lines P1 to Py are formed in the pixel portion 200. Note that the number of signal lines and the number of electric power source lines need not always be equal. Further, the number of first scanning lines and the number of second scanning lines need not always be equal. Furthermore, all of the wirings need not always be present, and in addition to these wirings, other different wirings may also be formed.

The electric power source wirings V1 to Vx are maintained at a predetermined voltage. Note that, although the structure of a light emitting device for displaying a monochrome image is shown in FIG. 2, the present invention may also be a light emitting device for displaying a color image. In that case, the size of the voltage need not be the same for all of the electric power source lines V1 to Vx, and may be changed for each corresponding color.

Note that, when not otherwise specified in this specification, the term voltage indicates an electric potential difference with ground.

Figure 3:
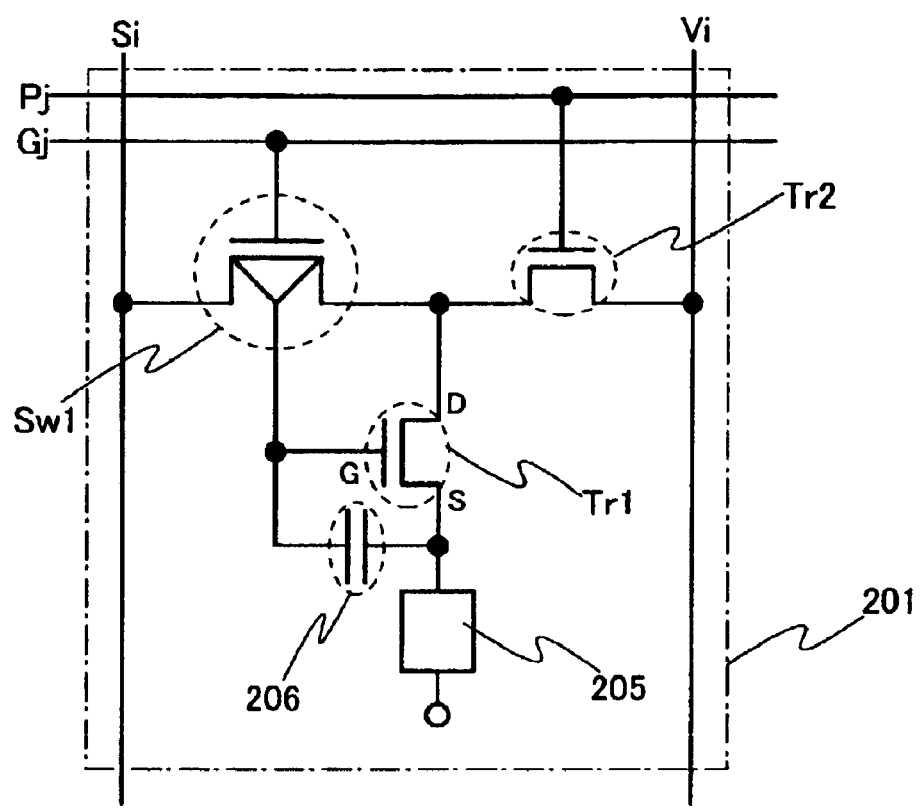
FIG. 3 is a circuit diagram of a pixel of a light emitting device of the present invention.

A detailed structural example of the pixel 201 of FIG. 2 is shown in FIG. 3. The pixel 201 shown in FIG. 3 has a signal line Si (one of the signal lines S1 to Sx), a first scanning line Gj (one of the scanning lines G1 to Gy), a second scanning line Pj (one of the scanning lines P1 to Py), and an electric power source line V1 (one of the electric power source lines V1 to Vx).

Further, the pixel 201 has a switching element Sw1 of the present invention, thin film transistors Tr1 and Tr2, an OLED 205, and a storage capacitor 206. The storage capacitor 206 is formed in order to ensure that a voltage between a gate electrode and a source region of the switching element Sw1 (gate voltage) is maintained, but need not always be formed provided that a gate capacitance of the thin film transistor Tr1 is sufficiently large.

The switching element Sw1 of the present invention is a thin film element with four terminals, which can control the connection of three nodes by the voltage applied to the gate electrode. The gate electrode of the switching element Sw1 is connected to the first scanning line Gj. One of three impurity regions of the switching element Sw1 is connected to the signal line Si, one is connected to a gate electrode of the transistor Tr1, and one is connected to a drain region of the transistor Tr1.

Note that, the voltage applied to the source region, which is an impurity region, is lower than the voltage applied to the drain region, which is also an impurity region, in this specification for cases of using n-channel transistors. Further, for cases in which p-channel transistors are used, the voltage applied to the source region is higher than the voltage applied to the drain region.

A gate electrode of the transistor Tr2 is connected to the second scanning line Pj. A source region or a drain region of the transistor Tr2 is connected to the drain region of the transistor Tr1, and the other region is connected to the electric power source line V1.

A source region of the transistor Tr1 is connected to a pixel electrode of the OLED 205. The OLED 205 has an anode and a cathode, and for cases in which the anode is used as a pixel electrode, the cathode is referred to as an opposing electrode in this specification. For cases in which the cathode is used as the pixel electrode, the anode is referred to as the opposing electrode.

One of two electrodes of the storage capacitor 206 is connected to the gate electrode of the switching element Sw1 and to the source region.

The voltage of the electric power source line Vi (electric power source voltage) is maintained at a constant size. Further, the voltage of the opposing electrode is also maintained at a constant size.

Note that the present invention is not limited to the circuit of FIG. 3. Assuming that the circuit of FIG. 3 is used, the transistor Tr1 may be either an n-channel transistor or a p-channel transistor. However, it is preferable that the transistor Tr1 be an n-channel transistor for cases in which the anode is used as the pixel electrode and the cathode is used as the opposing electrode. Conversely, it is preferable that the transistor Tr1 be a p-channel transistor for cases in which the anode is used as the opposing electrode and the cathode is used as the pixel electrode.

The switching element Sw1 and the transistor Tr2 may each be either n-channel or p-channel.

Figure 4:
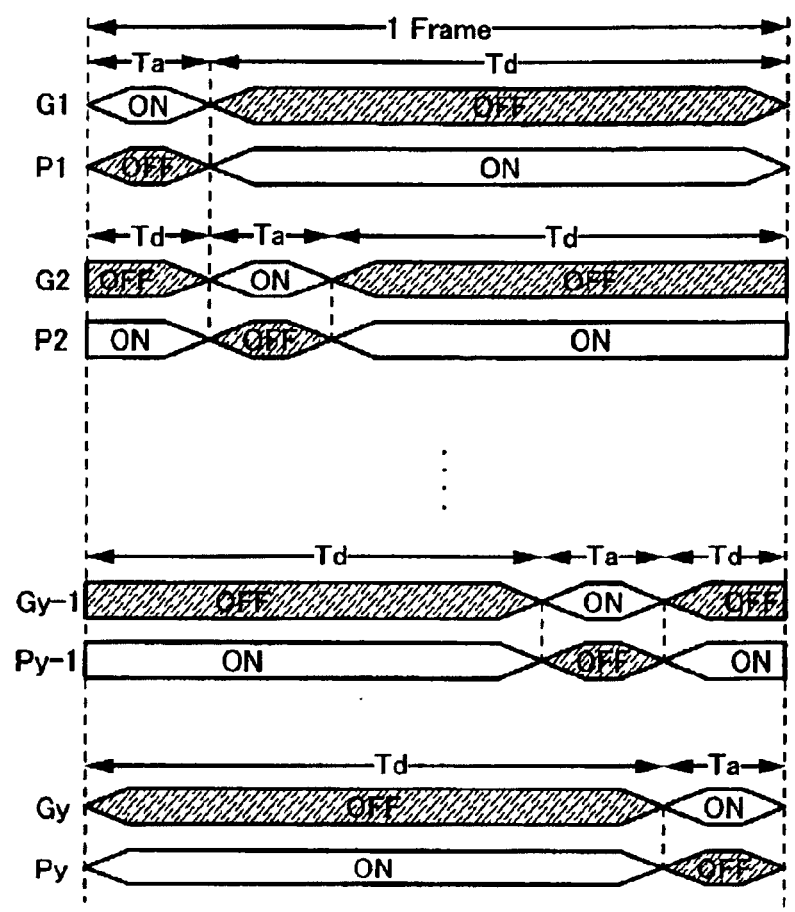
FIG. 4 is a timing chart of signals input to a scanning line.

Operation of the light emitting device of Embodiment Mode 2 stated above is explained next using FIG. 4 and FIGS. 5A and 5B. Operation of the light emitting device of the present invention can be explained by dividing each line of pixels into a write-in period Ta and a display period Td. A timing chart for the first and the second scanning lines is shown in FIG. 4. A period in which the scanning lines are selected, in other words a period in which transistors connected to the gate electrodes of the scanning lines are all in an on state, is shown by symbol ON. Conversely, a period in which the scanning lines are not selected, in other words a period in which the transistors connected to the gate electrodes of the scanning lines are all in an off state, is shown by symbol OFF. Further, FIGS. 5A and 5B are diagrams simply showing the structure of the pixels during the write in period Ta and the display period Td, respectively.

First, when the write in period Ta begins in a number 1 line of pixels, the first scanning line G1 is selected, and the switching elements Sw1 turn on. Note that the second scanning line P1 is not selected, and therefore the transistors Tr2 are off.

Electric currents Ic are then made to flow between the signal lines S1 to Sx and the opposing electrodes of the OLEDs 205, respectively, based on a video signal input to the signal line driver circuit 202. Note that the electric currents Ic are referred to as signal currents in this specification.

Figure 5A:
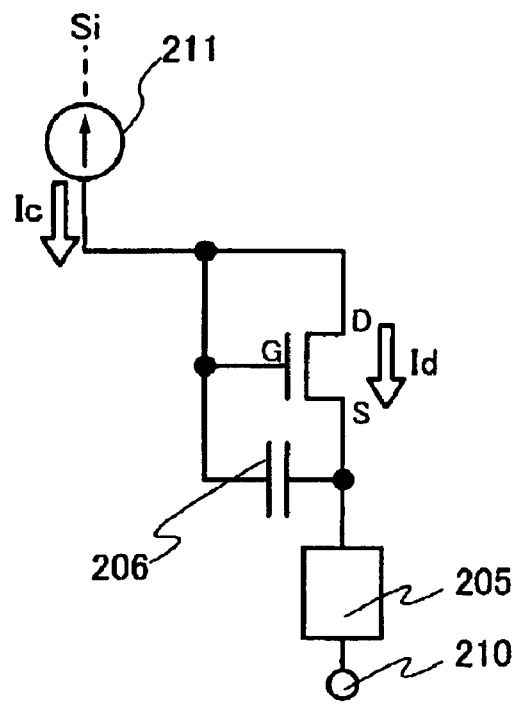
FIGS. 5A and 5B are schematic diagrams of a pixel during driving.
Figure 5B:
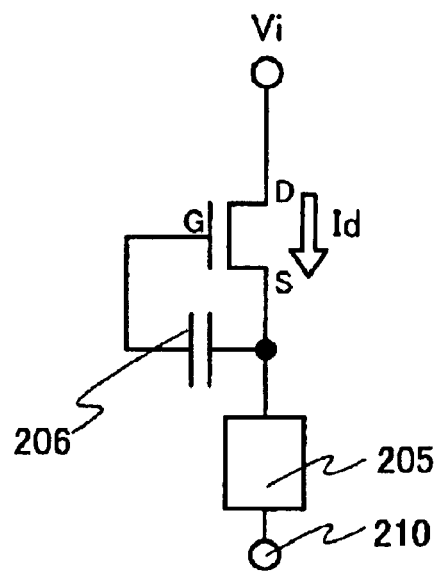

A schematic diagram of the pixel 201 is shown in FIG. 5A for a case in which the signal electric current Ic is made to flow in the signal line Si during the write in period Ta.

Reference numeral 210 denotes terminal used for connecting an electric power source which imparts a voltage to the opposing electrode. Further, reference numeral 211 denotes a constant electric current source of the signal line driver circuit 202.

The switching element Sw1 is on in the write in period, and therefore if the signal electric current Ic is made to flow in the signal line Si, an electric current Ic will be made to flow between the drain region and the source of the switching element Sw1 (drain electric current) is maintained at nearly the same value as the signal electric current Ic.

The transistor Tr1 is operated in the saturation region during the write in period because the gate electrode and the drain region are connected. Consequently, if the gate voltage is taken as $V_{GS}$, $\mu$ denotes mobility, $C_O$ denotes the gate capacitance per unit surface area, W/L denotes the ratio between the channel width W and the channel length L of a channel forming region, and $V_{TH}$ denotes the threshold value, then the drain electric current Id of the transistor Tr1 is expressed by Eq. 1 below.

$$Id = \mu C_O W/L (V_{GS} - V_{TH})^2 / 2 \quad [Eq. 1]$$

In Eq. 1, $\mu$, $C_O$, W/L, and $V_{TH}$ are all fixed values determined by each individual transistor. Further, the drain electric current Id of the transistor Tr1 is maintained at the same size as the signal electric current Ic by the constant electric current source 211. The gate voltage $V_{GS}$ of the transistor Tr1 is therefore determined by the value of the signal electric current Ic as can be understood from Eq. 1.

The drain current Id of the transistor Tr1 flows in the OLEDs 205, and the OLEDs 205 emit light at a brightness corresponding to the size of the electric current. If the drain current Id approaches zero without limit, and there is a reverse bias electric current, then the OLED 205 will not emit light.

Selection of the first scanning line G1 is complete when the write in period Ta is finished in the number 1 line of pixels. The write in period Ta then begins in a number 2 line of pixels, and the first scanning line G2 is selected. The switching elements Sw1 therefore turn on in a number 2 line of pixels. The second scanning line P2 is not selected, and therefore the transistors Tr2 are off.

The signal electric current Ic is then made to flow between the signal lines S1 to Sx and the opposing electrodes of the OLEDs 205, respectively, based on the video signal input to the signal line driver circuit 202. The electric current flowing in the OLEDs 205 is therefore maintained at the same size as the signal electric current Ic, and the OLEDs 2025 emit light at a brightness corresponding to the signal electric current Ic.

The write in period Ta is then complete for the number 2 line of pixels, and afterward, the write in period Ta begins in order from a number 3 line of pixels to a number y line of pixels, and the above described operations are repeated.

On the other hand, the display period Td begins when the write in period Ta is complete in the number 1 line of pixels. The second scanning line P1 is selected when the display period Td begins. The transistors Tr2 in the number 1 line of pixels therefore turn on. Note that the first scanning line G1 is not selected in the display period Td, and therefore the switching elements Sw1 are off.

A schematic diagram of a pixel in the display period Td is shown in FIG. 5B. The switching element Sw1 is off and the transistor Tr2 is on. Therefore the drain region of the transistor Tr1 is connected to the electric power source line Vi and a fixed voltage (electric power source voltage) is imparted.

Regarding the transistor Tr1, the voltage $V_{GS}$ determined in the write in period Ta is then stored by the storage capacitor 206, and the drain current Id of the switching element Sw1 continues to be maintained at the signal electric current Ic. The electric current flowing in the OLED 205 is therefore maintained at the same size as the signal electric current Ic, similarly to the case in the display period Td in the write in period Ta,. Consequently, the OLED 205 emits light during the display period Td at the same brightness as during the write in period Ta.

When the display period Td is complete in the number 1 line of pixels, the display period Td begins next in the number 2 line of pixels. Similarly to the number 1 line of pixels, the second scanning line P2 is selected, and the transistors Tr2 turn on. Note that the first scanning line G2 is not selected, and therefore the switching elements Sw1 are off. The OLEDs 205 then emit light at the same brightness as during the write in period.

The display period Td is then complete in the number 2 line of pixels, and subsequently the display period Td begins in order form the number 3 line of pixels to the number y line of pixels, and the above operations are repeated.

One frame period is complete when the write in period Ta and the display period Td are complete, and one image is displayed. The next frame period then begins, and the above operations are again repeated. The gray scale in each pixel is determined by the size of the electric current flowing in the OLED 205 in each pixel during the write in period Ta and the display period Td.

By adopting the above operations, even if the characteristics of the transistors Tr1, which control the amount of electric current flowing in the OLEDs, differ between pixels, significant dispersion between pixels in the size of the electric current flowing in the OLEDs can be prevented, and brightness irregularities can be suppressed.

Further, drops in OLED brightness can be suppressed, even if the organic light emitting layers deteriorate, in accordance with the above structure with the present invention, and a clear image can be displayed as a result. Furthermore, for color display light emitting devices that use OLEDs corresponding to each different colors, loss in the balance in brightness between each color can be prevented, and a desired color can be displayed, even if the OLED organic light emitting layers deteriorate at different speeds corresponding to color.

The OLED electric current can be controlled to a desired value even if the temperature of the organic light emitting layers is influenced by the atmospheric temperature, heat emitted by the OLED panel itself, and the like. The OLED electric current and the OLED brightness are thus proportional, and therefore changes in the OLED brightness can be suppressed, and further, an increase in electric current consumption following an increase in temperature can be prevented. For the case of color display light emitting devices, changes in brightness of each color of OLED can be suppressed without being influenced by temperature changes, and therefore loss in the balance in brightness between each color can be prevented and a desired color can be displayed.

In addition, the degree to which the OLED electric current changes due to changes in temperature generally differs by the type of the organic light emitting material in use, and therefore it is possible that the brightness of each OLED color in a color display will change in an inconsistent manner in accordance with temperature. However, a desired brightness can be obtained by the light emitting device of the present invention without being influenced by temperature changes, and therefore the balance between the brightness of each color can be prevented from being lost, and the desired color can be displayed.

Further, a desired value can be maintained for the electric current flowing in each OLED with the light emitting device of the present invention, and therefore changes in the gray scale caused by a reduction in electric potential due to wiring resistance can be prevented.

Further, by using the switching element of the present invention, the proportion of the surface area in each pixel occupied by the transistors can be suppressed.

Note that, with the organic light emitting elements used in Embodiment Mode 2, hole injecting layers, electron injecting layers, hole transporting layers, electron transporting layers, and the like may be independent inorganic compounds, and may also be formed by materials in which organic compounds and inorganic compounds are mixed. Further, portions of the layers themselves may be mutually mixed together.

Embodiment Mode 3

A case in which the video signal is analog is explained in Embodiment Mode 2, and it is also possible to perform driving by using a digital video signal.

For a case of a time gray scale driving method using a digital video signal (digital driving method), it is possible to display one image by having the write in period Ta and the display period Td repeatedly appear within one frame period.

For example, for a case of displaying an image by using an n-bit video signal, at least n write in periods and n display periods are formed within one frame period. The n write in periods Ta1 to Tan and the n display periods Td1 to Tdn correspond to each bit of the video signal.

Following the write in period Tam (where m is an arbitrary number from 1 to n), the display period corresponding to the same bit number appears, which is the display period Tdm in this case. The write in period Ta and the display period Td are together referred to as a subframe period SF. A subframe period having the write in period Tam and the display period Tdm corresponding to the number m bit becomes a subframe period SFm.

The length of subframe periods SF1 to SFn satisfies SF1::SF2:: . . . ::SFn=$2^0$::$2^1$:: . . . ::$2^{n-1}$.

Whether or not the OLEDs are made to emit light in each subframe period is selected by each bit of the digital video signal. The gray scale number can then be controlled by controlling the sum of the lengths of the display periods within one frame period during which light is emitted.

Note that long subframe periods of the display periods may also be divided into several subframe periods in order to increase image quality in display. A specific method is disclosed in Japanese Patent Application No. 2000-267164, and can therefore be referenced.

Note that the lifetime of the organic light emitting layers can be made longer by forming periods during which a reverse bias is applied to the organic light emitting layers.

Embodiments

Embodiments of the present invention are explained below.

Embodiment 1

Transistors of the present invention having a so-called multi-gate structure in which two or more channel forming regions are formed between each impurity region connected to a connection wiring is explained in Embodiment 1. Note that although a double gate structure transistor in which two channel forming regions are formed between each connection wiring is explained in Embodiment 1, the present invention is not limited to the double gate structure, and may also have a multi-gate structure in which three or more channel forming regions are formed between each connection wiring.

Figure 6A:
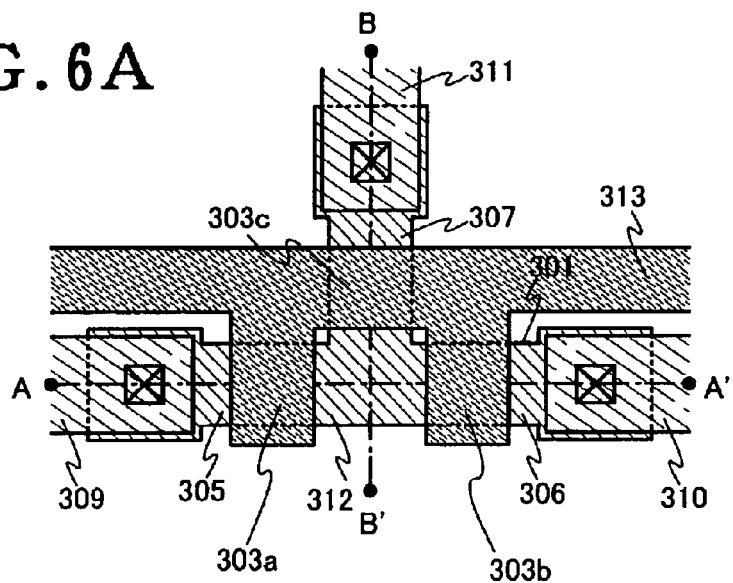
FIGS. 6A to 6C are diagrams showing the structure of a transistor of the present invention.
Figure 6B:
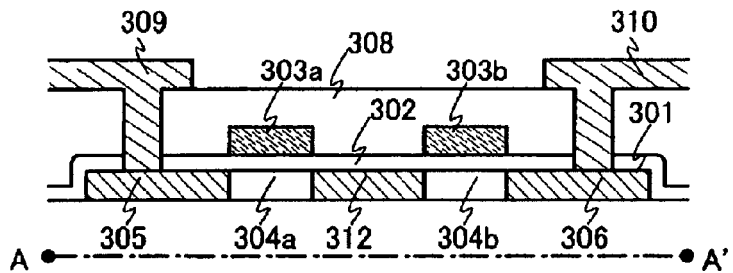
Figure 6C:
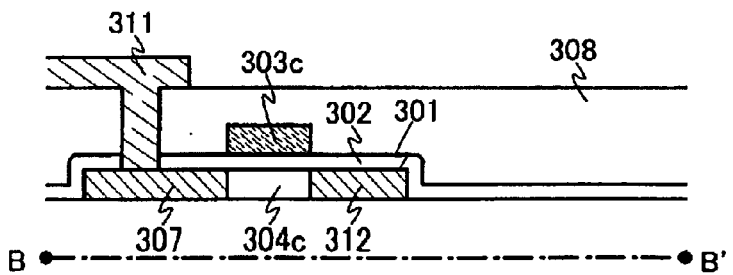

The structure of the transistor of Embodiment 1 is explained using FIGS. 6A to 6C. FIG. 6A is an upper surface diagram of a transistor of the present invention, FIG. 6B corresponds to a cross sectional diagram taken along a broken line segment A–A' of FIG. 6A, and FIG. 6C corresponds to a cross sectional diagram taken along a broken line segment B–B' of FIG. 6A.

The transistor of the present invention has an active layer 301, a gate insulating film 302 contacting the active layer 301, and gate electrodes 303a, 303b, and 303c contacting the gate insulating film 302. The gate electrodes 303a, 303b, and 303c are electrically connected, and all of the gate electrodes in Embodiment 1 are a portion of a gate wiring 313. The active layer 301 has channel forming regions 304a, 304b, and 304c, and impurity regions 305, 306, 307, and 312 to which an impurity that imparts conductivity has been added.

The gate electrode 303a and the channel forming region 304a overlap with each other while sandwiching the gate insulating film 302 therebeween. The gate electrode 303b and the channel forming region 304b overlap with each other while sandwiching the gate insulating film 302 therebetween. The gate electrode 303c and the channel forming region 304c overlap with each other while sandwiching the gate insulating film 302 therebetween.

The impurity regions 305, 306, and 307 are connected to the channel forming regions 304a, 304b, and 304c, respectively. The impurity region 312 is connected to all of the channel forming regions 304a, 304b, and 304c. The two channel forming regions 304a and 304b are therefore formed between the impurity regions 305 and 306, the two channel forming regions 304b and 304c are formed between the impurity regions 306 and 307, and the two channel forming regions 304c and 304a are formed between the channel forming regions 307 and 305.

Note that although all of the impurity regions are connected to the channel forming regions in Embodiment 1, the present invention is not limited to this structure. Low concentration impurity regions (LDD regions) having a lower impurity concentration than the impurity regions may also be formed between the impurity regions and the channel forming regions, and regions that do not overlap with the gate electrode and to which an impurity is not added (offset regions) may also be formed.

An insulating film 308 is formed on the gate insulating film 302 so as to cover the impurity regions 305, 306, and 307 of the active layer 301. Connection wirings 309, 310, and 311 for connecting to the impurity regions 305, 306, and 307, respectively, are then formed through contact holes formed in the insulating film 308 and in the gate insulating film 302. Note that, although the gate insulating film 302 covers the impurity regions 305, 306, and 307 in FIGS. 6A to 6C, the present invention is not limited to the structure. It is not always necessary for the impurity regions 305, 306, and 307 to be covered by the gate insulating film 302. They may also be exposed.

The switching element shown in FIGS. 6A to 6C has the resistance between each of the connection wirings 309, 310, and 311 controlled by a voltage applied to the gate electrodes 303a, 303b, and 303c.

Three nodes, specifically the connection wirings 309, 310, and 311 can be connected simultaneously with the switching element of FIGS. 6A to 6C. Note that, unless otherwise specified in this specification, the term connection indicates electrical connection.

Figure 15A:
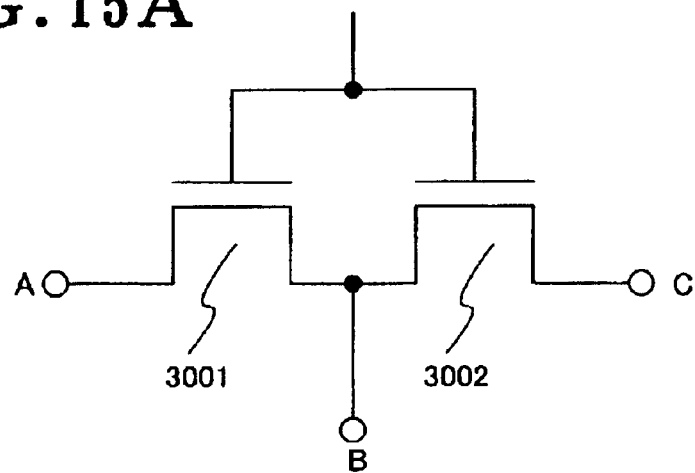
FIGS. 15A and 15B are a circuit diagram and an upper surface diagram, respectively, of a conventional transistor.
Figure 15B:
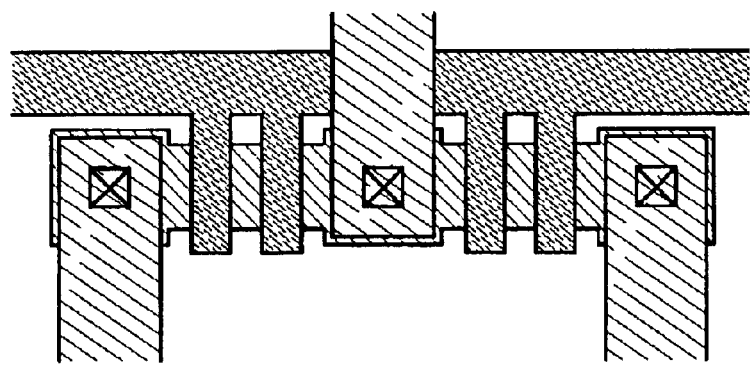

The surface area of the switching element can be suppressed in accordance with the above structure, and the surface area occupied by the switching element within pixels can be suppressed, and the pixels can be given higher definition. On the other hand, for a case of controlling the connection of the three nodes by using a double gate, three-terminal transistor, control is performed as in FIG. 15B, for example, but the surface area occupied is clearly larger than that of the switching element of FIG. 6A.

Further, compared to a single gate structure, the off electric current can be reduced with the multi-gate structure, and therefore this structure is more suitable to being used as a switching element.

Embodiment 2

A five-terminal switching element of the present invention with which connections between each of four nodes can be controlled by a voltage applied to a gate electrode is explained in Embodiment 2.

Figure 7A:
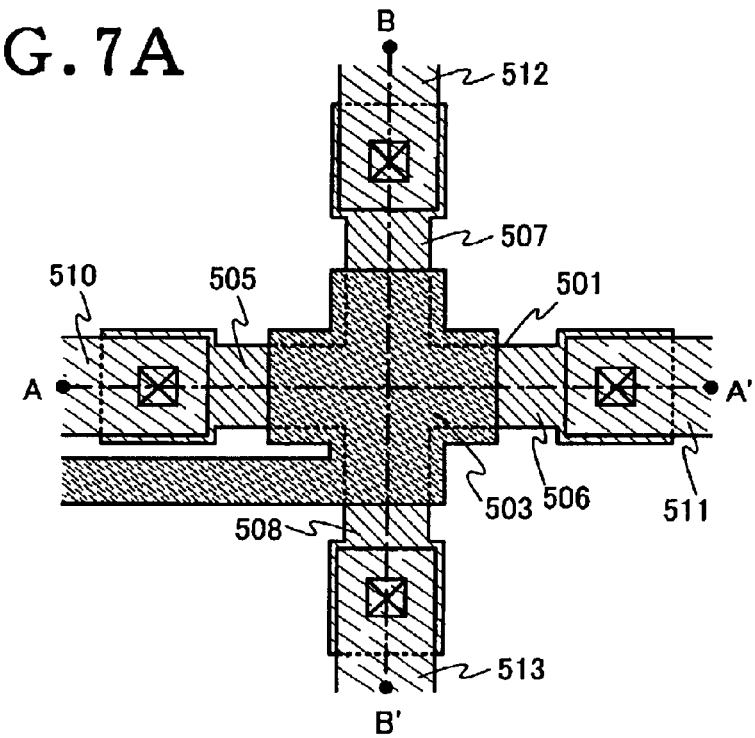
FIGS. 7A to 7C are diagrams showing the structure of a transistor of the present invention.
Figure 7B:
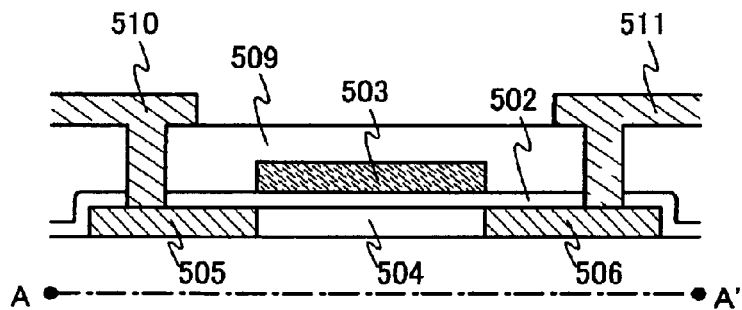
Figure 7C:
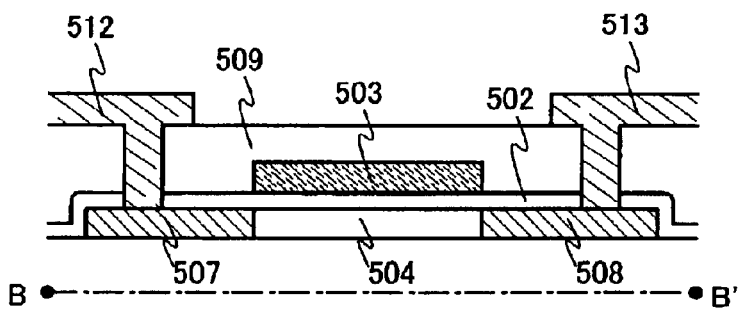

The structure of the switching element of the present invention is explained using FIGS. 7A to 7C. FIG. 7A is an upper surface diagram of a transistor of the present invention, FIG. 7B corresponds to a cross sectional diagram taken along a broken line segment A–A' of FIG. 7A, and FIG. 7C corresponds to a cross sectional diagram taken along a broken line segment B–B' of FIG. 7A.

The transistor of the present invention has an active layer 501, a gate insulating film 502 contacting the active layer 501, and gate electrode 503 contacting the gate insulating film 502. The active layer 501 has a channel forming region 504, and impurity regions 505, 506, 507, and 508 to which an impurity that imparts conductivity has been added. The gate electrode 503 and the channel forming region 504 overlap with each other while sandwiching the gate insulating film therebetween.

The impurity regions 505, 506, 507 and 508 are connected to the channel forming region 504, respectively. Note that although all of the impurity regions are connected to the channel forming regions 504 in Embodiment 2, the present invention is not limited to this structure. Low concentration impurity regions (LDD regions) having a lower impurity concentration than the impurity regions may also be formed between the impurity regions and the channel forming regions, and regions that do not overlap with the gate electrode and to which an impurity is not added (offset regions) may also be formed.

An insulating film 509 is formed on the gate insulating film 502 so as to cover the impurity regions 505, 506, 507 and 508 of the active layer 501. Connection wirings 510, 511, 512 and 513 for connecting to the impurity regions 505, 506, 507 and 508, respectively, are then formed through contact holes formed in the insulating film 509 and in the gate insulating film 502. Note that, although the gate insulating film 502 covers the impurity regions 505, 506, 507 and 508 in FIGS. 7A to 7C, the present invention is not limited to the structure. It is not always necessary for the impurity regions 505, 506, 507 and 508 to be covered by the gate insulating film 502. They may also be exposed.

The switching element shown in FIGS. 7A to 7C has the resistance between each of the connection wirings 510, 511, 512 and 513 controlled by a voltage applied to the gate electrode 503.

Four nodes, specifically the connection wirings 510, 511, 512 and 513 can be connected simultaneously with the switching element of FIGS. 7A to 7C. Note that, unless otherwise specified in this specification, the term connection indicates electrical connection.

The surface area of the switching element can be suppressed in accordance with the above structure, and the surface area occupied by the switching element within pixels can be suppressed, and the pixels can be given higher definition.

Note that, although a five-terminal transistor capable of controlling the connections between four nodes is explained in Embodiment 2, the transistor of the present invention is not limited to four terminals or five terminals. It is possible to form the transistor by making adjustments to the number of nodes.

Embodiment 3

A bottom gate transistor of the present invention in which a gate electrode is formed between a substrate and an active layer is explained in Embodiment 3.

Figure 8A:
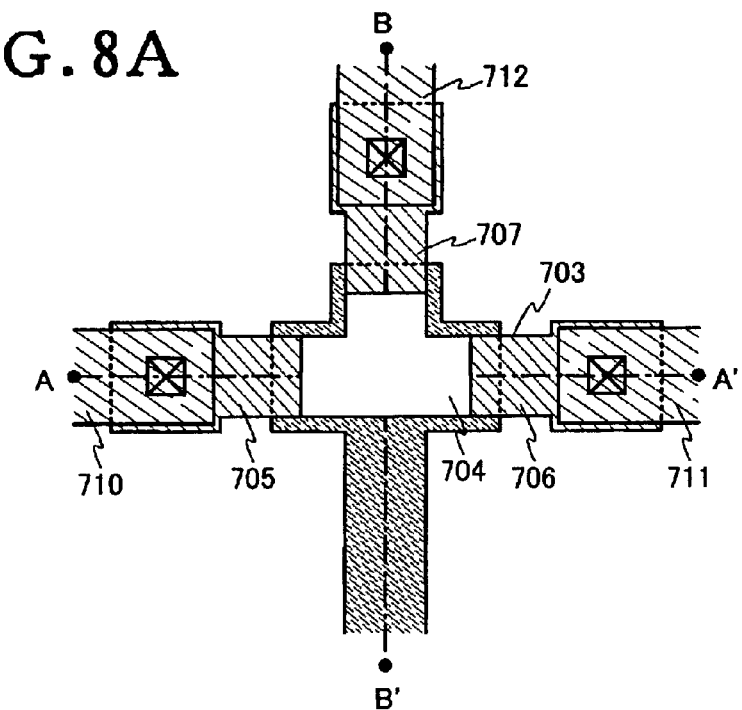
FIGS. 8A to 8C are diagrams showing the structure of a transistor of the present invention.
Figure 8B:
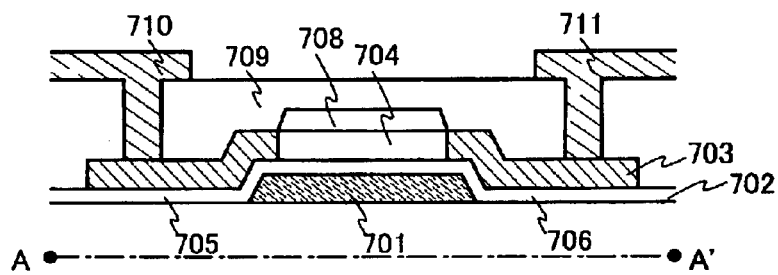
Figure 8C:
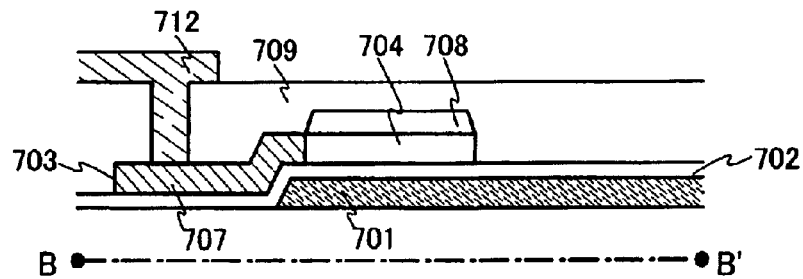

The structure of the transistor of the present invention is explained using FIGS. 8A to 8C. FIG. 8A is an upper surface diagram of a transistor of the present invention, FIG. 8B corresponds to a cross sectional diagram taken along a broken line segment A–A-40 of FIG. 8A, and FIG. 8C corresponds to a cross sectional diagram taken along a broken line segment B–B' of FIG. 8A.

The switching element of the present invention has a gate electrode 701, a gate insulating film 702 contacting the gate electrode 701, and an active layer 703 contacting the gate insulating film 702. The active layer 703 has the channel forming region 704 and impurity regions 705, 706, and 707 to which an impurity that imparts conductivity has been added. The gate electrode 701 and the channel forming region 704 overlap with each other while sandwiching the gate insulating film 702 therebetween. Note that, reference numeral 708 is a mask used in forming the channel forming region, which is formed by the insulating film.

The impurity regions 705, 706, and 707 are connected to the channel forming region 704, respectively. Note that although all of the impurity regions are connected to the channel forming region 704 in Embodiment 3, the present invention is not limited to this structure. Low concentration impurity regions (LDD regions) having a lower impurity concentration than the impurity regions may also be formed between the impurity regions and the channel forming regions, and regions that do not overlap with the gate electrode and to which an impurity is not added (offset regions) may also be formed.

An insulating film 709 is formed so as to cover the impurity regions 705, 706, and 707 of the active layer 703. Connection wirings 710, 711, and 712 for connecting to the impurity regions 705, 706, and 707, respectively, are then formed through contact holes formed in the insulating film 709.

The switching element shown in FIGS. 8A to 8C has the resistance between each of the connection wirings 710, 711, and 712 controlled by a voltage applied to the gate electrode 701.

Three nodes, specifically the connection wirings 710, 711, and 712 can be connected simultaneously with the switching element of FIGS. 8A to 8C. Note that, unless otherwise specified in this specification, the term connection indicates electrical connection.

The surface area of the switching element can be suppressed in accordance with the above structure, and the surface area occupied by the switching element within pixels can be suppressed, and the pixels can be given higher definition.

Note that the multi-gate structure in which two or more channel forming regions are formed between each connection wiring may also be used.

Embodiment 4

The present invention will be described the configuration of a driver circuit provided for a light emitting device of the present invention, witch is driven by an analog driver method (a signal line driver circuit, a first scanning line driver circuit, and a second scanning line driver circuit).

Figure 9A:
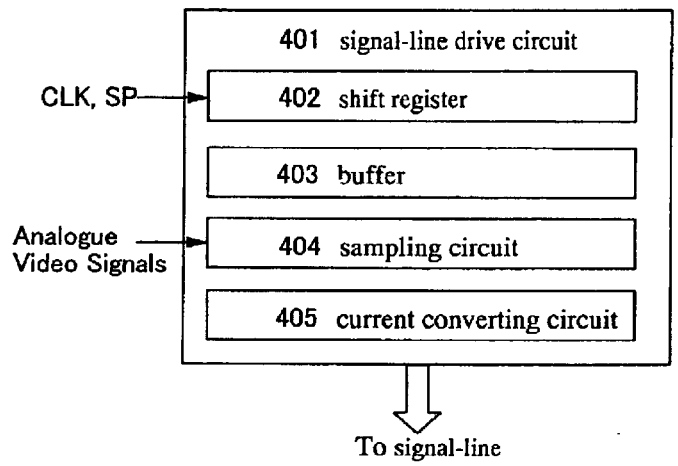
FIGS. 9A and 9B are detailed drawings of a signal line driver circuit in an analog driving method.

FIG. 9A exemplifies a schematic block diagram of a signal-line drive circuit 401 utilized for implementing the present invention. Reference numeral 402 designates a shift register, 403 a buffer, 404 a sampling circuit, and 405 a current converting circuit.

A clock signal (CLK) and a start-up pulse signal (SP) are input to the shift register 402. Upon the input of the clock signal (CLK) and the start-up pulse signal (SP) into the shift register 402, a timing signal is generated.

The generated timing signal is amplified or buffered and amplified by the buffer 403 and then input to the sampling circuit 404. It is also practicable to replace the buffer with a level shifter to amplify the timing signal. Alternatively, both the buffer and the level shifter may be provided.

Figure 9B:
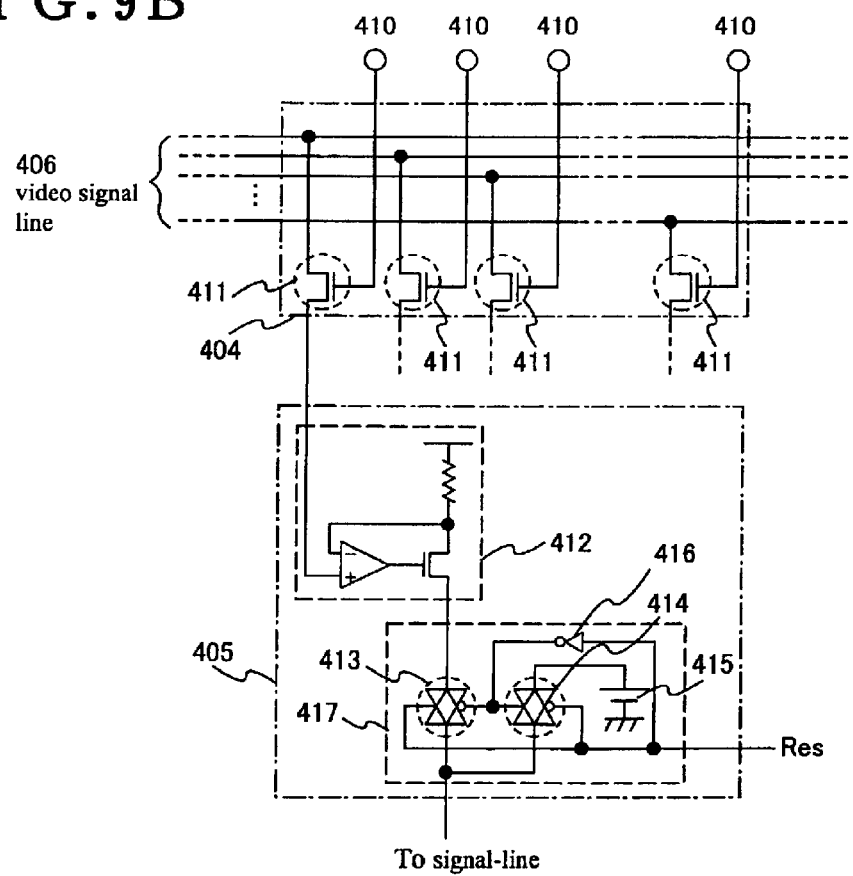

A specific configuration of the sampling circuit 404 and a current converting circuit 405 is shown in FIG. 9B. Note that, the sampling circuit 404 is connected to the buffer 403 at a terminal 410.

The sampling circuit 404 is provided with a plurality of switches 411. The sampling circuit 404 receives analog video signals fed from a video signal line 406. Synchronously with the timing signal, the switches 411 sample the input analog video signals and then input the sampled analog video signals to the current converting circuit 405 located at the subsequent stage. It should be noted that FIG. 9B solely exemplifies the current converting circuit 405 connected to one of the switches 411 built in the sampling circuit 404 among the above-referred current converting circuits. However, it is assumed that the current converting circuit 405 shown in FIG. 9B is connected to each of the individual switches 411 at their subsequent stages.

In this example, only one transistor is utilized for individual switches 411. It should be understood that, however, insofar as analog video signal can properly be sampled synchronously with the timing signal, there is no restriction on the configuration of the switches 411 described above.

The sampled analog video signals are then input to a current output circuit 412 provided for the current converting circuit 405. The current output circuit 412 outputs a current (a signal current) of a value corresponding to the voltage borne by the input analog video signals. In FIG. 9, the current output circuit 412 is formed by using an amplifier and a transistor. However, the scope of the present invention is not solely limited to this configuration but any circuit capable of outputting current corresponding to the voltage of the input analog video signal may also be utilized.

The above-referred signal current is delivered to a reset circuit 417 present in the current converting circuit 405, where the reset circuit 417 comprises a pair of analog switches 413 and 414, an inverter 416, a power supply 415.

A reset signal (Res) is input to the analog switche 414, whereas the other analog switch 413 receives a reset signal (Res) inverted by the inverter 416. The analog switch 413 and the other analog switch 414 are individually operated synchronously with the inverted reset signal and the rest signal, respectively, and thus, while either of the analog switches 413 and 414 remains ON, the other remains OFF.

While the analog switch 413 remains ON, the signal current is delivered to a corresponding signal line. On the other hand, while the analog switch 414 remains ON, a voltage of the power supply 415 is delivered to the signal line. Thus the signal line is reset. It is desired that the voltage of the power supply 415 is almost same as the voltage of the power supply line provided for pixel. And the current supplied to the signal line when the signal line is reset is preferably close to 0 as much as possible.

It is desired that the signal line be reset during the retracing period. However, except for a period during display of picture images, it is also practicable to reset the signal line in such a period other than the retracing period as required.

In place of a shift register, it is also practicable to utilize such a different circuit like a decoder circuit capable of selecting any of signal lines.

Next, the configuration of a first scanning line driver circuit will be described.

FIG. 10 exemplifies a schematic block diagram of a first scanning line driver circuit 641. The first scanning line driver circuit 641 includes a sift register 642 and buffer 643. According to circumstances, the first scanning line driver circuit 641 may have a level shifter.

By inputting of the clock signal (CLK) and the start-up pulse signal (SP) into the shift register 642, a timing signal is generated in the first scanning line driver circuit 641. The generated timing signal is buffered and amplified by the buffer 643 and then supply to a first scanning line.

The gate electrodes of a switching element (Sw 1) for one line of pixels are connected to the first scanning line. The switching element (Sw 1) of the one line of pixels must be placed in an ON state simultaneously. A circuit which is capable of handling the flow of a large electric current is therefore used for the buffer 643.

In place of a shift register, it is also practicable to utilize such a different circuit like a decoder circuit capable of selecting any of scanning lines.

Further, a second scanning line driver circuit may have a same configuration as the first scanning line driver circuit.

Incidentally, voltages of the first and second scanning line may be controlled by a plurality of the scanning line driver circuits corresponding to each scanning lines, respectively. Also, the voltages of some of the scanning lines or all of scanning lines may be controlled by one scanning line driver circuit.

Practical configurations of the signal-line drive circuit and the scanning line driver circuit for driving the light emitting device of the present invention are not solely limited to the one exemplified in this embodiment. The configuration of this embodiment may also be realized by being freely combined with those configurations exemplified in the preceding Embodiments 1 to 3.

Embodiment 5

Figure 11A:
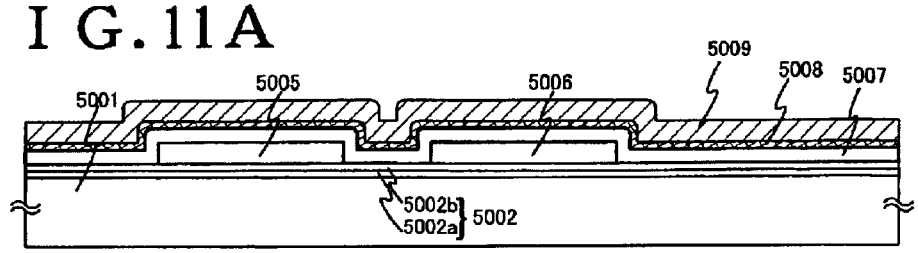
FIGS. 11A to 11D are diagrams showing a method of manufacturing a light emitting device of the present invention.

In Embodiment 5, the method of manufacturing the light emitting device of the present invention is described as an example with reference to FIGS. 11A thorough 11D and FIGS. 12A through 12D. The method of manufacturing the light emitting device including pixels illustrated in FIG. 2 is described. Note that, switching elements SW 1 and Tr 1 are typically illustrated here. Although, a transistor Tr 2 is not illustrated particularly, the transistor Tr 2 can be manufactured in accordance with the manufacturing method of the present embodiment.

First, as shown in FIG. 11A a base film 5002 formed of an insulating film such as a silicon oxide film, a silicon nitride film or a silicon oxynitride film is formed on a substrate 5001 formed of glass such as barium borosilicate glass or alumino borosilicate glass represented by #7059 glass and #1737 glass of Coning Corporation. For example, a silicon oxynitride film 5002a formed from $SiH_4$, $NH_3$ and $N_2O$ by the plasma CVD method and having a thickness of from 10 to 200 nm (preferably 50 to 100 nm) is formed. Similarly, a hydrogenerated silicon oxynitride film 5002b formed from SiH$_4$ and N$_2$O and having a thickness of from 50 to 200 nm (preferably 100 to 150 nm) is layered thereon. In this embodiment, the base film 5002 has a two-layer structure, but may also be formed as a single layer film of one of the above insulating films, or a laminate film having more than two layers of the above insulating films.

Island-like semiconductor layers 5005 to 5006 are formed from a crystalline semiconductor film obtained by conducting laser crystallization method or a known thermal crystallization method on a semiconductor film having an amorphous structure. Each of these island-like semiconductor layers 5005 to 5006 has a thickness of from 25 to 80 nm (preferably 30 to 60 nm). No limitation is put on the material of the crystalline semiconductor film, but the crystalline semiconductor film is preferably formed from silicon, a silicon germanium (SiGe) alloy, etc.

When the crystalline semiconductor film is to be manufactured by the laser crystallization method, an excimer laser, a YAG laser and an YVO$_4$ laser of pulse oscillation type or continuous light-emitting type are used. When these lasers are used, it is preferable to use a method in which a laser beam radiated from a laser oscillator is converged into a linear shape by an optical system and then is irradiated to the semiconductor film. A crystallization condition is suitably selected by an operator. When the excimer laser is used, pulse oscillation frequency is set to 300 Hz, and laser energy density is set to from 100 to 400 mJ/cm$^2$ (typically 200 to 300 mJ/cm$^2$). When the YAG laser is used, pulse oscillation frequency is preferably set to from 30 to 300 kHz by using its second harmonic, and laser energy density is preferably set to from 300 to 600 mJ/cm$^2$ (typically 350 to 500 mJ/cm$^2$). The laser beam converged into a linear shape and having a width of from 100 to 1000 μm, e.g. 400 μm is, is irradiated to the entire substrate surface. At this time, overlapping ratio of the linear laser beam is set to from 50 to 90%.

Note that, a gas laser or solid state laser of continuous oscillation type or pulse oscillation type can be used. The gas laser such as an excimer laser, Ar laser, Kr laser and the solid state laser such as YAG laser, YVO$_4$ laser, YLF laser, YAlO$_3$ laser, glass laser, ruby laser, alexandrite laser, Ti: sapphire laser can be used as the laser beam. Also, crystals such as YAG laser, YVO$_4$ laser, YLF laser, YAlO$_3$ laser wherein Cr, Nd, Er, Ho, Ce, Co, Ti or Tm is doped can be used as the solid state laser. A basic wave of the lasers is different depending on the materials of doping, therefore a laser beam having a basic wave of approximately 1 μm is obtained. A harmonic corresponding to the basic wave can be obtained by the using non-linear optical elements.

When a crystallization of an amorphous semiconductor film is conducted, it is preferable that the second harmonic through the fourth harmonic of basic waves is applied by using the solid state laser which is capable of continuous oscillation in order to obtain a crystal in large grain size. Typically, it is preferable that the second harmonic (with a thickness of 532 nm) or the third harmonic (with a thickness of 355 nm) of an Nd: YVO$_4$ laser (basic wave of 1064 nm) is applied. Specifically, laser beams emitted from the continuous oscillation type YVO$_4$ laser with 10 W output is converted into a harmonic by using the non-linear optical elements. Also, a method of emitting a harmonic by applying crystal of YVO$_4$ and the non-linear optical elements into a resonator. Then, more preferably, the laser beams are formed so as to have a rectangular shape or an elliptical shape by an optical system, thereby irradiating a substance to be treated. At this time, the energy density of approximately 0.01 to 100 MW/cm$^2$ (preferably 0.1 to 10 MW/cm$^2$) is required. The semiconductor film is moved at approximately 10 to 2000 cm/s rate relatively corresponding to the laser beams so as to irradiate the semiconductor film.

Next, a gate insulating film 5007 covering the island-like semiconductor layers 5005 to 5006 is formed. The gate insulating film 5007 is formed from an insulating film containing silicon and having a thickness of from 40 to 150 nm by using the plasma CVD method or a sputtering method. In this embodiment, the gate insulating film 5007 is formed from a silicon oxynitride film with a thickness of 120 nm. However, the gate insulating film is not limited to such a silicon oxynitride film, but it may be an insulating film containing other silicon and having a single layer or a laminated layer structure. For example, when a silicon oxide film is used, TEOS (Tetraethyl Orthosilicate) and O$_2$ are mixed by the plasma CVD method, the reaction pressure is set to 40 Pa, the substrate temperature is set to from 300 to 400° C., and the high frequency (13.56 MHz) power density is set to from 0.5 to 0.8 W/cm$^2$ for electric discharge. Thus, the silicon oxide film can be formed by discharge. The silicon oxide film manufactured in this way can then obtain preferable characteristics as the gate insulating film by thermal annealing at from 400 to 500° C.

A first conductive film 5008 and a second conductive film 5009 for forming a gate electrode are formed on the gate insulating film 5007. In this embodiment, the first conductive film 5008 having a thickness of from 50 to 100 nm is formed from Ta, and the second conductive film 5009 having a thickness of from 100 to 300 nm is formed from W.

The Ta film is formed by a sputtering method, and the target of Ta is sputtered by Ar. In this case, when suitable amounts of Xe and Kr are added to Ar, internal stress of the Ta film is released, and pealing off this film can be prevented. Resistivity of the Ta film of a phase is about 20 μWcm, and this Ta film can be used for the gate electrode. However, resistivity of the Ta film of β phase is about 180 ì Wcm, and is not suitable for the gate electrode. When tantalum nitride having a crystal structure close to that of the α phase of Ta and having a thickness of about 10 to 50 nm is formed in advance as the base for the Ta film to form the Ta film of the a phase, the Ta film of α phase can be easily obtained.

The W film is formed by the sputtering method with W as a target. Further, the W film can be also formed by a thermal CVD method using tungsten hexafluoride (WF$_6$). In any case, it is necessary to reduce resistance to use this film as the gate electrode. It is desirable to set resistivity of the W film to be equal to or smaller than 20 ì Wcm. When crystal grains of the W film are increased in size, resistivity of the W film can be reduced. However, when there are many impurity elements such as oxygen, etc. within the W film, crystallization is prevented and resistivity is increased. Accordingly, in the case of the sputtering method, a W-target of 99.9999% or 99.99% in purity is used, and the W film is formed by taking a sufficient care of not mixing impurities from a gaseous phase into the W film when the film is to be formed. Thus, a resistivity of from 9 to 20 ì Wcm can be realized.

In this embodiment, the first conductive film 5008 is formed from Ta, and the second conductive film 5009 is formed from W. However, the present invention is not limited to this case. Each of these conductive films may also be formed from an element selected from Ta, W, Ti, Mo, Al and Cu, or an alloy material or a compound material having these elements as principal components. Further, a semiconductor film represented by a polysilicon film doped with an impurity element such as phosphorus may also be used.

Examples of combinations other than those shown in this embodiment include: a combination in which the first conductive film 5008 is formed from tantalum nitride (TaN), and the second conductive film 5009 is formed from W; a combination in which the first conductive film 5008 is formed from tantalum nitride (TaN), and the second conductive film 5009 is formed from Al; and a combination in which the first conductive film 5008 is formed from tantalum nitride (TaN), and the second conductive film 5009 is formed from Cu.

Next, a mask 5010 is formed from a resist, and first etching processing for forming an electrode and wiring is performed. In this embodiment, an ICP (Inductively Coupled Plasma) etching method is used, and $CF_4$ and $Cl_2$ are mixed with a gas for etching. RF (13.56 MHz) power of 500 W is applied to the electrode of coil type at a pressure of 1 Pa so that plasma is generated. RF (13.56 MHz) of 100 W power is also applied to a substrate side (sample stage), and a substantially negative self bias voltage is applied. When $CF_4$ and $Cl_2$ are mixed, the W film and the Ta film are etched to the same extent.

Under the above etching condition, end portions of a first conductive layer and a second conductive layer are formed into a tapered shape by effects of the bias voltage applied to the substrate side by making the shape of the mask formed from the resist into an appropriate shape. The angle of a taper portion is set to from 15° to 45°. It is preferable to increase an etching time by a ratio of about 10 to 20% so as to perform the etching without leaving the residue on the gate insulating film. Since a selection ratio of a silicon oxynitride film to the W film ranges from 2 to 4 (typically 3), an exposed face of the silicon oxynitride film is etched by about 20 to 50 nm by over-etching processing. Thus, conductive layers 5013 to 5014 of a first shape (first conductive layers 5013a to 5014a and second conductive layers 5013b to 5014b) formed of the first and second conductive layers are formed by the first etching processing. A region that is not covered with the conductive layers 5013 to 5014 of the first shape is etched by about 20 to 50 nm in the gate insulating film 5007, so that a thinned region is formed.

Figure 11B:
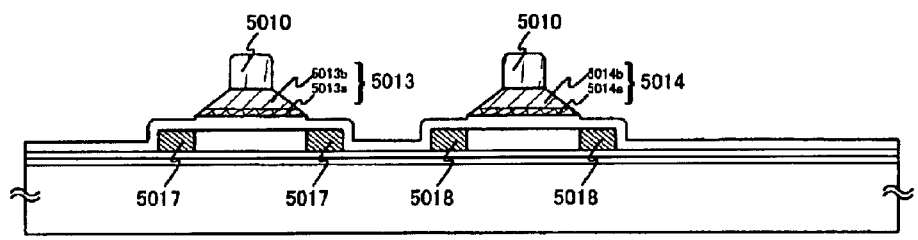

Then, an impurity element for giving an n-type conductivity is added by performing first doping processing. A doping method may be either an ion doping method or an ion implantation method. The ion doping method is carried out under the condition that a dose is set to from $1 \times 10^{13}$ to $5 \times 10^{14}$ atoms/cm$^2$, and an acceleration voltage is set to from 60 to 100 keV. An element belonging to group 15, typically, phosphorus (P) or arsenic (As) is used as the impurity element for giving the n-type conductivity. However, phosphorus (P) is used here. In this case, the conductive layers 5013 to 5014 serve as masks with respect to the impurity element for giving the n-type conductivity, and first impurity regions 5017 to 5018 are formed in a self-aligning manner. The impurity element for giving the n-type conductivity is added to the first impurity regions 5017 and 5018 in a concentration range from $1 \times 10^{20}$ to $1 \times 10^{21}$ atoms/cm$^3$ (FIG. 11B).

Figure 11C:
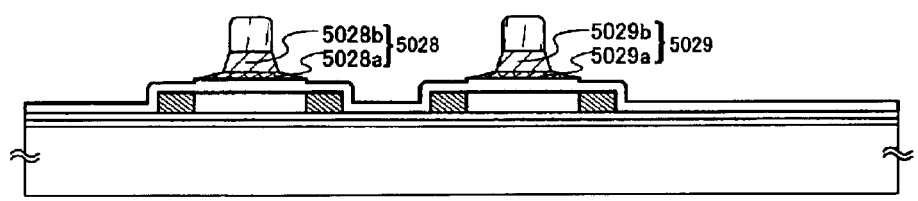

Second etching processing is next performed without removing the resist mask as shown in FIG. 11C. A W film is etched selectively by using $CF_4$, $Cl_2$ and $O_2$ as the etching gas. The conductive layers 5028 to 5029 of a second shape (first conductive layers 5028a to 5029a and second conductive layers 5028b to 5029b) are formed by the second etching processing. A region of the gate insulating film 5007, which is not covered with the conductive layers 5028 to 5029 of the second shape, is further etched by about 20 to 50 nm so that a thinned region is formed.

An etching reaction in the etching of the W film or the Ta film using the mixed gas of $CF_4$ and $Cl_2$ can be assumed from the vapor pressure of a radical or ion species generated and a reaction product. When the vapor pressures of a fluoride and a chloride of W and Ta are compared, the vapor pressure of $WF_6$ as a fluoride of W is extremely high, and vapor pressures of other $WCl_5$, $TaF_5$ and $TaCl_5$ are approximately equal to each other. Accordingly, both the W film and the Ta film are etched using the mixed gas of $CF_4$ and $Cl_2$. However, when a suitable amount of $O_2$ is added to this mixed gas, $CF_4$ and $O_2$ react and become CO and F so that a large amount of F-radicals or F-ions is generated. As a result, the etching speed of the W film whose fluoride has a high vapor pressure is increased. In contrast to this, the increase in etching speed is relatively small for the Ta film when F is increased. Since Ta is easily oxidized in comparison with W, the surface of the Ta film is oxidized by adding $O_2$. Since no oxide of Ta reacts with fluorine or chloride, the etching speed of the Ta film is further reduced. Accordingly, it is possible to make a difference in etching speed between the W film and the Ta film so that the etching speed of the W film can be set to be higher than that of the Ta film.

Figure 11D:
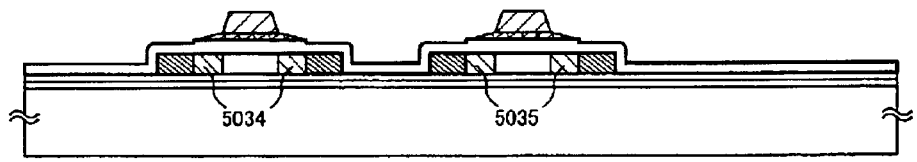

As shown in FIG. 11D, second doping processing is then performed. In this case, an impurity element for giving the n-type conductivity is doped in a smaller dose than in the first doping processing and at a high acceleration voltage by reducing a dose lower than that in the first doping processing. For example, the acceleration voltage is set to from 70 to 120 keV, and the dose is set to $1 \times 10^{13}$ atoms/cm$^2$. Thus, a new impurity region is formed inside the first impurity region formed in the island-like semiconductor layer in FIG. 11B. In the doping, the conductive layers 5028 to 5029 of the second shape are used as masks with respect to the impurity element, and the doping is performed such that the impurity element is also added to regions underside the first conductive layers 5028a to 5029a. Thus, third impurity regions 5034 to 5035 are formed. The third impurity regions 5034 to 5035 contain phosphorus (P) with a gentle concentration gradient that conforms with the thickness gradient in the tapered portions of the first conductive layers 5028a to 5029a. In the semiconductor layers that overlap the tapered portions of the first conductive layers 5028a to 5029a, the impurity concentration is slightly lower around the center than at the edges of the tapered portions of the first conductive layers 5028a to 5029a. However, the difference is very slight and almost the same impurity concentration is kept throughout the semiconductor layers.

Figure 12A:
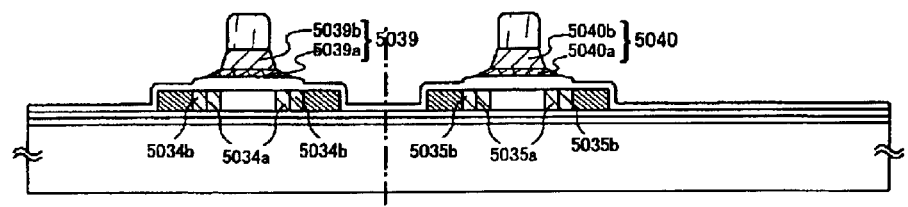
FIGS. 12A to 12D are diagrams showing the method of manufacturing a light emitting device of the present invention.

Third etching treatment is then carried out as shown in FIG. 12A. $CHF_6$ is used as etching gas, and reactive ion etching (RIE) method is employed. Through the third etching treatment, the tapered portions of the first conductive layers 5028a and 5029a are partially etched to reduce the regions where the first conductive layers overlap the semiconductor layers. Thus formed are third shape conductive layers 5039 to 5040 (first conductive layers 5039a to 5040a and second conductive layers 5039b to 5040b). At this point, regions of the gate insulating film 5007 that are not covered with the third shape conductive layers 5039 to 5040 are further etched and thinned by about 20 to 50 nm.

Third impurity regions 5034 and 5035 are formed through the third etching treatment. The third impurity regions 5034a to 5035a that overlap the first conductive layers 5039a to 5040a, respectively, and second impurity regions 5034b to 5035b each formed between a first impurity region and a third impurity region.

Figure 12B:
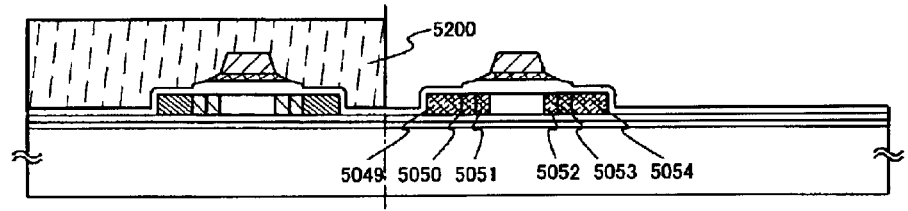

As shown in FIG. 12B, fourth impurity regions 5049 to 5054 having the opposite conductivity type to the first conductivity type are formed in the island-like semiconductor layer 5005 for forming p-channel type TFTs. The third shape conductive layers 5040b is used as masks against the impurity element and impurity regions are formed in a self-aligning manner. At this point, the island-like semiconductor layer 5006 for forming n-channel type TFTs is entirely covered with a resist mask 5200. The impurity regions 5049 to 5054 have already been doped with phosphorus in different concentrations. The impurity regions 5049 to 5054 are doped with diborane ($B_2H_6$) through ion doping and its impurity concentrations are set to form $2\times10^{20}$ to $2\times10^{21}$ atoms/cm$^3$ in the respective impurity regions.

Through the steps above, the impurity regions are formed in the respective island-like semiconductor layers. The third shape conductive layers 5039 to 5040 overlapping the island-like semiconductor layers function as gate electrodes.

After resist mask 5200 is removed, a step of activating the impurity elements added to the island-like semiconductor layers is performed to control the conductivity type. This process is performed by a thermal annealing method using a furnace for furnace annealing. Further, a laser annealing method or a rapid thermal annealing method (RTA method) can be applied. In the thermal annealing method, this process is performed at a temperature of from 400 to 700° C., typically from 500 to 600° C. within a nitrogen atmosphere in which oxygen concentration is equal to or smaller than 1 ppm and is preferably equal to or smaller than 0.1 ppm. In this embodiment, heat treatment is performed for four hours at a temperature of 500° C. When a wiring material used in the third shape conductive layers 5039 to 5040 is weak against heat, it is preferable to perform activation after an interlayer insulating film (having silicon as a principal component) is formed in order to protect wiring, etc.

When the laser annealing method is employed, the laser used in the crystallization can be used. When activation is performed, the moving speed is set as well as the crystallization processing, and the energy density of about 0.01 to 100 MW/cm$^2$ (preferably 0.01 to 10 MW/cm$^2$) is required.

Further, the heat treatment is performed for 1 to 12 hours at a temperature of from 300 to 450° C. within an atmosphere including 3 to 100% of hydrogen so that the island-like semiconductor layer is hydrogenerated. This step is to terminate a dangling bond of the semiconductor layer by hydrogen thermally excited. Plasma hydrogenation (using hydrogen excited by plasma) may also be performed as another measure for hydrogenation.

Figure 12C:
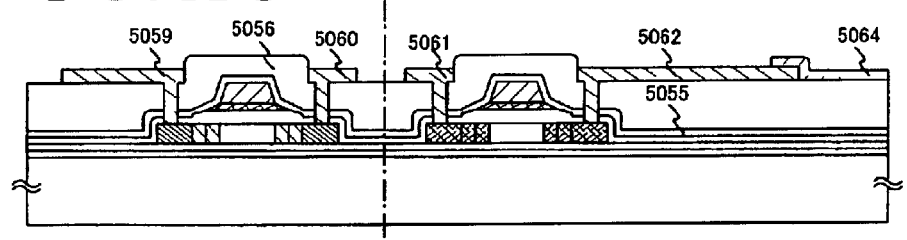

Next, as shown in FIG. 12C, a first interlayer insulating film 5055 is formed from a silicon oxynitride film with a thickness of 100 to 200 nm. The second interlayer insulating film 5056 from an organic insulating material is formed on the first interlayer insulating film. Thereafter, contact holes are formed through the first interlayer insulating film 5055, the second interlayer insulating film 5056 and the gate insulating film 5007. Then wirings 5059 to 5062 are patterned and formed, and a pixel electrode 5064, which is connected with a connecting wiring 5062, is patterned and formed.

A film having an organic resin as a material is used as the second interlayer insulating film 5056. Polyimide, polyamide, acrylic, BCB (benzocyclobutene), etc. can be used as this organic resin. In particular, since the second interlayer insulating film 5056 is provided mainly for planarization, acrylic excellent in leveling the film is preferable. In this embodiment, an acrylic film having a thickness that can sufficiently level a level difference caused by the TFT is formed. The film thickness thereof is preferably set to from 1 to 5 μm (is further preferably set to from 2 to 4 μm).

In the formation of the contact holes, contact holes reaching n-type impurity region 5017 or p-type impurity regions 5049 and 5054, are formed respectively by using dry etching or wet etching.

Further, a laminate film of a three-layer structure is patterned in a desired shape and is used as wirings (including connecting wiring, and signal line) 5059 to 5062. In this three-layer structure, a Ti film with a thickness of 100 nm, an aluminum film containing Ti with a thickness of 300 nm, and a Ti film with a thickness of 150 nm are continuously formed by the sputtering method. Of course, another conductive film may also be used.

In this embodiment, an ITO film of 110 nm in thickness is formed as a pixel electrode 5064, and is patterned. Contact is made by arranging the pixel electrode 5064 such that this pixel electrode 5064 comes in contact with the connecting wiring 5062 and is overlapped with this connecting wiring 5062. Further, a transparent conductive film provided by mixing 2 to 20% of zinc oxide (ZnO) with indium oxide may also be used. This pixel electrode 5064 becomes an anode of the OLED (FIG. 12C).

Figure 12D:
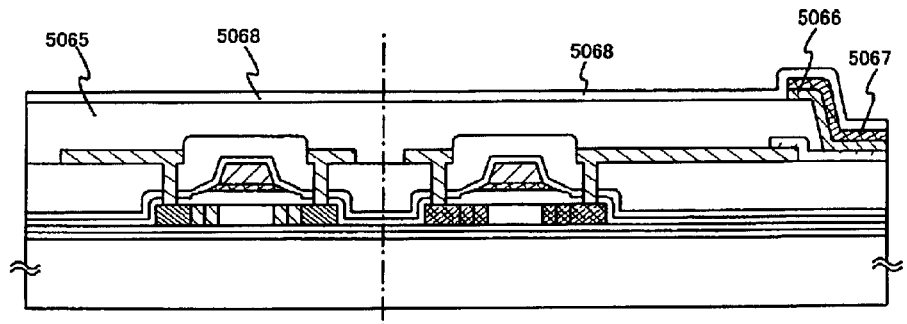

As shown in FIG. 12D, an insulating film (a silicon oxide film in this embodiment) containing silicon and having a thickness of 500 nm is next formed. A third interlayer insulating film 5065 functions as a bank is formed in which an opening is formed in a position corresponding to the pixel electrode 5064. When the opening is formed, a side wall of the opening can easily be tapered by using the wet etching method. When the side wall of the opening is not gentle enough, deterioration of an organic light emitting layer caused by a level difference becomes a notable problem.

Next, an organic light emitting layer 5066 and a cathode (MgAg electrode) 5067 are continuously formed by using the vacuum evaporation method without exposing to the atmosphere. The organic light emitting layer 5066 has a thickness of from 80 to 200 nm (typically from 100 to 120 nm), and the cathode 5067 has a thickness of from 180 to 300 nm (typically from 200 to 250 nm).

In this process, the organic light emitting layer is sequentially formed with respect to a pixel corresponding to red, a pixel corresponding to green and a pixel corresponding to blue. In this case, since the organic light emitting layer has an insufficient resistance against a solution, the organic light emitting layer must be formed separately for each color instead of using a photolithography technique. Therefore, it is preferable to cover a portion except for desired pixels using a metal mask so that the organic light emitting layer is formed selectively only in a required portion.

Namely, a mask for covering all portions except for the pixel corresponding to red is first set, and the organic light emitting layer for emitting red light are selectively formed by using this mask. Next, a mask for covering all portions except for the pixel corresponding to green is set, and the organic light emitting layer for emitting green light are selectively formed by using this mask. Next, a mask for covering all portions except for the pixel corresponding to blue is similarly set, and the organic light emitting layer for emitting blue light are selectively formed by using this mask. Here, different masks are used, but instead the same single mask may be used repeatedly.

Here, a system for forming three kinds of OLED corresponding to RGB is used. However, a system in which an OLED for emitting white light and a color filter are combined, a system in which the OLED element for emitting blue or blue green light is combined with a fluorescent substance (a fluorescent color converting medium: CCM), a system for overlapping the OLED elements respectively corresponding to R, G, and B with the cathodes (opposite electrodes) by utilizing a transparent electrode, etc. may be used.

A known material can be used as the organic light emitting layer 5066. An organic material is preferably used as the known material in consideration of a driving voltage. For example, a four-layer structure consisting of a hole injection layer, a hole transportation layer, a light emitting layer and an electron injection layer is preferably used for the organic light emitting layer.

Next, the cathode 5067 is formed by using a metal mask. This embodiment uses MgAg for the cathode 5067 but it is not limited thereto. Other known materials may be used for the cathode 5067.

Finally, a passivation film 5068 which is a silicon nitride film is formed maintaining a thickness of 300 nm. Upon forming the passivation film 5068, the organic compound layer 5066 is protected from the moisture so as to exhibit further improved reliability of OLEDS.

Thus, the light emitting device of a structure shown in FIG. 12D is completed.

Upon arranging TFTs of an optimum structure not only in the pixel portion but also in the driving circuit portion, the light emitting device of this embodiment exhibits a very high reliability and improved operation characteristics. In the step of crystallization, further, it is also allowable to add a metal catalyst such as Ni to enhance the crystallinity. Thus, the driving frequency of a signal line driver circuit can be set to 10 MHz or more.

First, the TFT having a structure for reducing hot carrier injection so as not to reduce an operating speed as much as possible is used as an n-channel type TFT of a CMOS circuit forming the driving circuit portion. Here, the driving circuit includes a shift register, a buffer, a level shifter, a latch in line sequential driving, a transmission gate in dot sequential driving, etc.

In the case of this embodiment, an active layer of the n-channel type TFT includes a source region, a drain region, an overlap LDD region ($L_{OV}$ region) that is overlapped with the gate electrode through the gate insulating film, an offset LDD region ($L_{OFF}$ region) that is not overlapped with the gate electrode through the gate insulating film, and channel formation region.

Deterioration by the hot carrier injection in the p-channel type TFT of the CMOS circuit is almost neglectible. Therefore, it is not necessary to particularly form the LDD region in this n-channel type TFT. However, similar to the n-channel type TFT, the LDD region can be formed as a hot carrier countermeasure.

Further, when the CMOS circuit for bi-directionally flowing an electric current through a channel forming region, i.e., the CMOS circuit in which roles of the source and drain regions are exchanged is used in the driving circuit, it is preferable for the n-channel type TFT that constitutes the CMOS circuit to form LDD regions such that the channel forming region is sandwiched between the LDD regions. As an example of this, a transmission gate used in the dot sequential driving is given. When a CMOS circuit required to reduce an OFF-state current value as much as possible is used in the driving circuit, the n-channel type TFT forming the CMOS circuit preferably has a Lov region. The transmission gate used in the dot sequential driving can be given also as an example as such.

In reality, when the light emitting device is completed to the state shown in FIG. 12D, it is preferable to perform packaging (sealing) using a protective film (a laminate film, an ultraviolet curable resin film, etc.) that has a high airtight seal property and allows little degasification and a translucent sealing member in order to prevent to be exposed to the outside air. In this case, reliability of OLED is improved by filling the interior of the sealing member with an inert gas atmosphere and arranging a moisture absorbing material (e.g., barium oxide) therein.

Further, after the airtight seal property is improved by processing of packaging, etc., a connector (flexible printed circuit: FPC) is attached to complete the device as a product. The connector is for connecting, with an external signal terminal, a terminal led out from the element or the circuit which is formed on the substrate. The device in this state is ready to be shipped and is called a self-emission device in this specification.

Furthermore, in accordance with the processes shown in this embodiment, the number of photomasks can be reduced that is need for manufacturing the light emitting device. As a result, the processes can be reduced, and this contributes to a reduction in the manufacturing costs and an increase in throughput.

Note that it is possible to implement Embodiment 5 in combination with Embodiments 1, 2 and 4.

Embodiment 6

In this embodiment, an external light emitting quantum efficiency can be remarkably improved by using an organic light emitting material by which phosphorescence from a triplet exciton can be employed for emitting a light. As a result, the power consumption of the OLED can be reduced, the lifetime of the OLED can be elongated and the weight of the OLED can be lightened.

The following is a report where the external light emitting quantum efficiency is improved by using the triplet exciton (T. Tsutsui, C. Adachi, S. Saito, Photochemical processes in Organized Molecular Systems, ed. K. Honda, (Elsevier Sci. Pub., Tokyo, 1991) p. 437).

The molecular formula of an organic light emitting material (coumarin pigment) reported by the above article is represented as follows.

(Chemical formula 1)

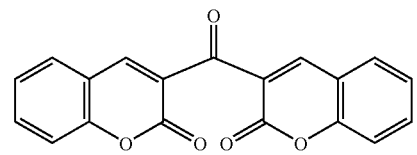

(M. A. Baldo, D. F. O'Brien, Y. You, A. Shoustikov, S. Sibley, M. E. Thompson, S. R. Forrest, Nature 395 (1998) p.151)

The molecular formula of an organic light emitting material (Pt complex) reported by the above article is represented as follows.

(Chemical formula 2)

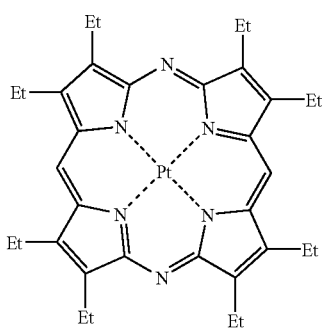

(M. A. Baldo, S. Lamansky, P. E. Burrows, M. E. Thompson, S. R. Forrest, Appl. Phys. Lett., 75 (1999) p.4.)
(T. Tsutsui, M.-J.Yang, M. Yahiro, K. Nakamura, T. Watanabe, T. Tsuji, Y Fukuda, T. Wakimoto, S. Mayaguchi, Jpn, Appl. Phys., 38 (12B) (1999) L1502)

The molecular formula of an organic light emitting material (Ir complex) reported by the above article is represented as follows.

(Chemical formula 3)

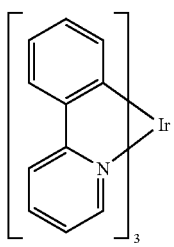

As described above, if phosphorescence from a triplet exciton can be put to practical use, it can realize the external light emitting quantum efficiency three to four times as high as that in the case of using fluorescence from a singlet exciton in principle.

The structure according to this embodiment can be freely implemented in combination of any structures of Embodiments 1 through 5.

Embodiment 7

Figure 13A:
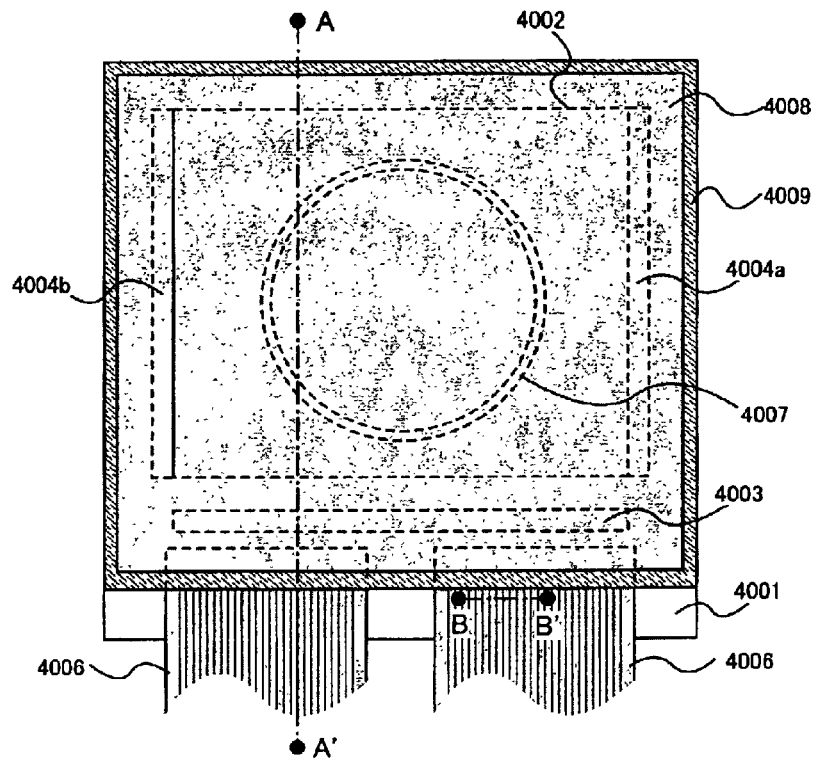
FIGS. 13A to 13C are an external view and cross sectional diagrams, respectively, of a light emitting device of the present invention.
Figure 13B:
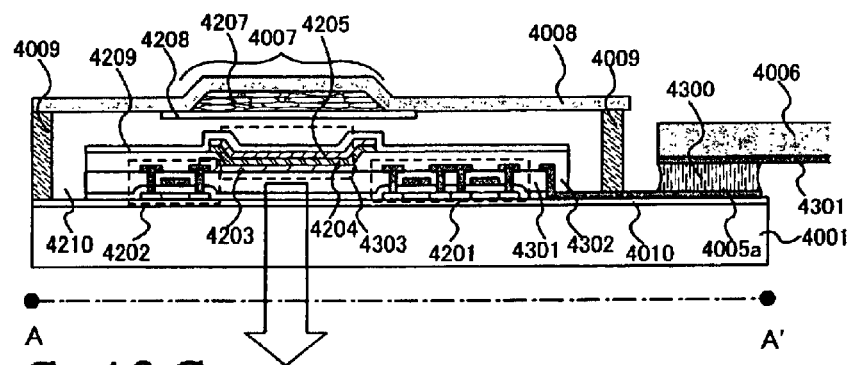
Figure 13C:
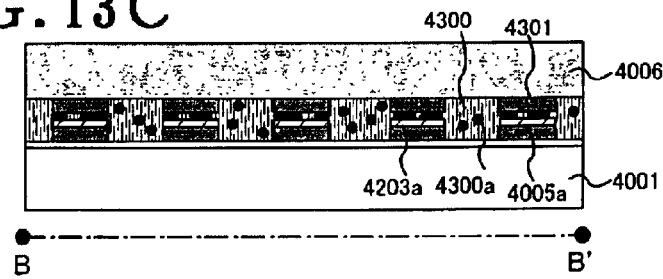

In this embodiment, an external appearance of the light emitting device of the present invention is described with FIGS. 13A to 13C.

FIG. 13A is a top view of the light emitting device which is formed according as the element substrate with the transistor is sealed by sealing materials, FIG. 13B is a cross sectional view taken along with a line A–A40 of FIG. 13A, and FIG. 13C is a cross sectional view taken along with a line B–B' of FIG. 13A.

A seal member 4009 is provided so as to surround a pixel portion 4002, a signal line driver circuit 4003, and the first, second scanning line driver circuits 4004a, 4004b, which are provided on a substrate 4001. Further, a sealing material 4008 is provided on the pixel portion 4002, the signal line driver circuit 4003, and the first, the second scanning line driver circuits 4004a, 4004b. Thus, the pixel portion 4002, the signal line driver circuit 4003, and the first, the second scanning line driver circuits 4004a, 4004b are sealed by the substrate 4001, the seal member 4009 and the sealing material 4008 together with a filler 4210.

Further, the pixel portion 4002, the signal line driver circuit 4003, and the first, the second scanning line driver circuits 4004a, 4004b, which are provided on the substrate 4001, have a plurality of TFTs. In FIG. 13B, a driving TFT (here, an n-channel TFT and a p-channel TFT are shown in the figure) 4201 included in the signal line driver circuit 4003 and a transistor Tr1 4202 included in the pixel portion 4002, which are formed on a base film 4010, are typically shown.

In this embodiment, the p-channel TFT or the n-channel TFT manufactured by a known method is used as the driving TFT 4201, and the n-channel TFT manufactured by a known method is used as the transistor Tr1 4202.

An interlayer insulating film (leveling film) 4301 is formed on the driving TFT 4201 and the transistor Tr1 4202, and a pixel electrode (anode) 4203 electrically connected to a drain of the transistor Tr1 4202 is formed thereon. A transparent conductive film having a large work function is used for the pixel electrode 4203. A compound of indium oxide and tin oxide, a compound of indium oxide and zinc oxide, zinc oxide, tin oxide or indium oxide can be used for the transparent conductive film. The above transparent conductive film added with gallium may also be used.

Then, an insulating film 4302 is formed on the pixel electrode 4203, and the insulating film 4302 is formed with an opening portion on the pixel electrode 4203. In this opening portion, an organic light-emitting layer 4204 is formed on the pixel electrode 4203. A known organic light-emitting material or inorganic light-emitting material may be used for the organic light-emitting layer 4204. Further, there exist a low molecular weight (monomer) material and a polymeric material (polymer) as the organic light-emitting materials, and both the materials may be used.

A known evaporation technology or application technique may be used as a method of forming the organic light-emitting layer 4204. Further, the structure of the organic light-emitting layer may take a lamination structure or a single layer structure by freely combining a hole injecting layer, a hole transporting layer, a light-emitting layer, an electron transporting layer and an electron injecting layer.

A cathode 4205 made of a conductive film having light-shielding property (typically, conductive film containing aluminum, copper or silver as its main constituent or lamination film of the above conductive film and another conductive film) is formed on the organic light-emitting layer 4204. Further, it is desirable that moisture and oxygen that exist on an interface of the cathode 4205 and the organic light-emitting layer 4204 are removed as much as possible. Therefore, such a device is necessary that the organic light-emitting layer 4204 is formed in a nitrogen or rare gas atmosphere, and then, the cathode 4205 is formed without exposure to oxygen and moisture. In this example, the above-described film deposition is enabled by using a multi-chamber type (cluster tool type) film forming device. In addition, a predetermined voltage is given to the cathode 4205.

As described above, an OLED 4303 constituted of the pixel electrode (anode) 4203, the organic light-emitting layer 4204 and the cathode 4205 is formed. Further, a protective film 4209 is formed on the insulating film 4302 so as to cover the OLED 4303. The protective film 4209 is effective in preventing the intrusion of oxygen, moisture and the like from the OLED 4303.

Reference numeral 4005a denotes a wiring drawn to be connected to the power supply line, and the wiring 4005a is electrically connected to a source region of the transistor Tr1 4202. The drawn wiring 4005a passes between the seal member 4009 and the substrate 4001, and is electrically connected to an FPC wiring 4301 of an FPC 4006 through an anisotropic conductive film 4300.

A glass material, a metal material (typically, stainless material), a ceramics material or a plastic material (including a plastic film) can be used for the sealing material 4008. As the plastic material, an FRP (fiberglass-reinforced plastics) plate, a PVF (polyvinyl fluoride) film, a Mylar film, a polyester film or an acrylic resin film may be used. Further, a sheet with a structure in which an aluminum foil is sandwiched with the PVF film or the Mylar film can also be used.

However, in the case where the light from the light emitting element is emitted toward the cover member side, the cover member needs to be transparent. In this case, a transparent substance such as a glass plate, a plastic plate, a polyester film or an acrylic film is used.

Further, in addition to an inert gas such as nitrogen or argon, an ultraviolet curable resin or a thermosetting resin may be used as the filler 4210, so that PVC (polyvinyl chloride), acrylic, polyimide, epoxy resin, silicone resin, PVB (polyvinyl butyral) or EVA (ethylene vinyl acetate) can be used. In this example, nitrogen is used for the filler.

Moreover, a concave portion 4007 is provided on the surface of the sealing material 4008 on the substrate 4001 side, and a hygroscopic substance or a substance that can absorb oxygen 4207 is arranged therein in order that the filler 4210 is made to be exposed to the hygroscopic substance (preferably, barium oxide) or the substance that can absorb oxygen. Then, the hygroscopic substance or the substance that can absorb oxygen 4207 is held in the concave portion 4007 by a concave portion cover member 4208 such that the hygroscopic substance or the substance that can absorb oxygen 4207 is not scattered. Note that the concave portion cover member 4208 has a fine mesh form, and has a structure in which air and moisture are penetrated while the hygroscopic substance or the substance that can absorb oxygen 4207 is not penetrated. The deterioration of the OLED 4303 can be suppressed by providing the hygroscopic substance or the substance that can absorb oxygen 4207.

As shown in FIG. 13C, the pixel electrode 4203 is formed, and at the same time, a conductive film 4203a is formed so as to contact the drawn wiring 4005a.

Further, the anisotropic conductive film 4300 has conductive filler 4300a. The conductive film 4203a on the substrate 4001 and the FPC wiring 4301 on the FPC 4006 are electrically connected to each other by the conductive filler 4300a by thermo Compression bonding the substrate 4001 and the FPC 4006.

Note that the structure of Embodiment 7 can be implemented by being freely combined with the structures shown in Embodiments 1 to 6.

Embodiment 8

Organic light emitting materials used in OLEDs are roughly divided into low molecular weight materials and polymeric materials. A light-emitting device of the present invention can employ a low molecular weight organic light emitting material and a polymeric organic light emitting material both. Further, materials which are difficult to be classified into low molecular weight materials and polymeric materials (such as a material disclosed in Japanese Patent Application No. 2001-167508 and the like) may be used.

A low molecular weight organic light emitting material is formed into a film by evaporation. This makes it easy to form a laminate structure, and the efficiency is increased by layering films of different functions such as a hole transporting layer and an electron transporting layer. For example, as shown in the Japanese Patent Application No. 2001-020817 etc., the low molecular weight organic light emitting material may be used in order to elongate the lifetime of the OLED and to increase the light emitting efficiency since a hall transporting layer, an electron transporting layer, etc. are not necessarily exist clearly and single layer or a plurality of layer of a mixed state layer is exist in the low molecular weight organic light emitting material.

Examples of low molecular weight organic light emitting material include an aluminum complex having quinolinol as a ligand ($Alq_3$), a triphenylamine derivative (TPD) and the like.

On the other hand, a polymeric organic light emitting material is physically stronger than a low molecular weight material and enhances the durability of the element. Furthermore, a polymeric material can be formed into a film by application and therefore manufacture of the element is relatively easy.

The structure of a light emitting element using a polymeric organic light emitting material is basically the same as the structure of a light emitting element using a low molecular weight organic light emitting material, and has a cathode, an organic light emitting layer, and an anode. When an organic light emitting layer is formed from a polymeric organic light emitting material, a two-layer structure is popular among the known ones. This is because it is difficult to form a laminate structure using a polymeric material unlike the case of using a low molecular weight organic light emitting material. Specifically, an element using a polymeric organic light emitting material has a cathode, a light emitting layer, a hole transporting layer, and an anode. Note that, Ca may be employed as the cathode material in a light emitting element using a polymeric organic light emitting material.

The color of light emitted from an element is determined by the material of its light emitting layer. Therefore, a light emitting element that emits light of desired color can be formed by choosing an appropriate material. The polymeric organic light emitting material that can be used to form a light emitting layer is a polyparaphenylene vinylene-based material, a polyparaphenylene-based material, a polythiophen-based material, or a polyfluorene-based material.

The polyparaphenylene vinylene-based material is a derivative of poly(paraphenylene vinylene) (denoted by PPV), for example, poly(2, 5-dialkoxy-1,4-phenylene vinylene) (denoted by RO-PPV), poly(2-(2'-ethyl-hexoxy)-5-metoxy-1,4-phenylene vinylene) (denoted by MEH-PPV), poly(2-(dialkoxyphenyl)-1,4-phenylene vinylene) (denoted by ROPh-PPV), etc.

The polyparaphenylene-based material is a derivative of polyparaphenylene (denoted by PPP), for example, poly(2, 5-dialkoxy-1,4-phenylene) (denoted by RO-PPP), poly(2,5-dihexoxy-1,4-phenylene), etc.

The polythiophene-based material is a derivative of polythiophene (denoted by PT), for example, poly(3-alkylthiophene) (denoted by PAT), poly(3-hexylthiophene) (denoted by PHT), poly(3-cyclohexylthiophene) (denoted by PCHT), poly(3-cyclohexyl-4-methylthiophene) (denoted by PCHMT), poly(3,4-dicyclohexylthiophene) (denoted by PDCHT), poly[3-(4-octylphenyl)-thiophene] (denoted by POPT), and poly[3-(4-octylphenyl)-2,2 bithiophene] (denoted by PTOPT), etc.

The polyfluorene-based material is a derivative of polyfluorene (denoted by PF), for example, poly(9,9-dialkylfluorene) (denoted by PDAF) and poly(9, 9-dioctylfluorene) (denoted by PDOF).

If a layer that is formed of a polymeric organic light emitting material capable of transporting holes is sandwiched between an anode and a polymeric organic light emitting material layer that emits light, injection of holes from the anode is improved. This hole transporting material is generally dissolved into water together with an acceptor material, and the solution is applied by spin coating or the like. Since the hole transporting material is insoluble in an organic solvent, the film thereof can form a laminate with the above-mentioned organic light emitting material layer that emits light.

The polymeric organic light emitting material capable of transporting holes is obtained by mixing PEDOT with camphor sulfonic acid (denoted by CSA) that serves as the acceptor material. A mixture of polyaniline (denoted by PANI) and polystyrene sulfonic acid (denoted by PSS) that serves as the acceptor material may also be used.

The structure of this embodiment may be freely combined with any of the structures of Embodiments 1 through 7.

Embodiment 9

The light emitting device using the OLED is of the self-emission type, and thus exhibits more excellent recognizability of the displayed image in a light place as compared to the liquid crystal display device. Furthermore, the light emitting device has a wider viewing angle. Accordingly, the light emitting device can be applied to a display portion in various electronic devices.

Such electronic devices using a light emitting device of the present invention include a video camera, a digital camera, a goggles-type display (head mount display), a navigation system, a sound reproduction device (such as a car audio equipment and an audio set), a lap-top computer, a game machine, a portable information terminal (such as a mobile computer, a mobile telephone, a portable game machine, and an electronic book), an image reproduction apparatus including a recording medium (more specifically, an apparatus which can reproduce a recording medium such as a digital versatile disc (DVD) and so forth, and includes a display for displaying the reproduced image), or the like. In particular, in the case of the portable information terminal, use of the light emitting device is preferable, since the portable information terminal that is likely to be viewed from a tilted direction is often required to have a wide viewing angle. FIGS. 14A to 14H respectively shows various specific examples of such electronic devices.

Figure 14A:
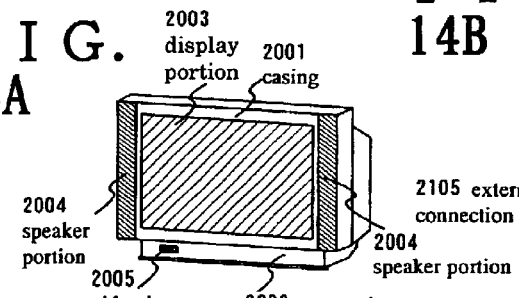
FIGS. 14A to 14H are diagrams of electronic equipment using a light emitting device of the present invention.

FIG. 14A illustrates an OLED display device which includes a casing 2001, a support table 2002, a display portion 2003, a speaker portion 2004, a video input terminal 2005 and the like. The present invention is applicable to the display portion 2003. The light emitting device is of the self-emission-type and therefore requires no backlight. Thus, the display portion thereof can have a thickness thinner than that of the liquid crystal display device. The OLED display device is including the entire display device for displaying information, such as a personal computer, a receiver of TV broadcasting and an advertising display.

Figure 14B:
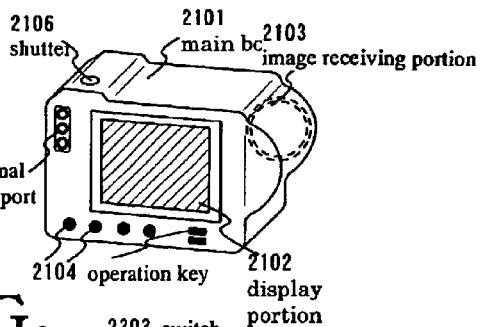

FIG. 14B illustrated a digital still camera which includes a main body 2101, a display portion 2102, an image receiving portion 2103, an operation key 2104, an external connection port 2105, a shutter 2106, and the like. The light emitting device of the present invention can be used as the display portion 2102.

Figure 14C:
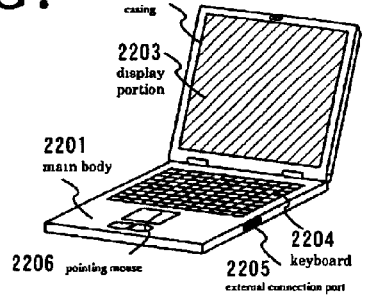

FIG. 14C illustrates a lap-top computer which includes a main body 2201, a casing 2202, a display portion 2203, a keyboard 2204, an external connection port 2205, a pointing mouse 2206, and the like. The light emitting device of the present invention can be used as the display portion 2203.

Figure 14D:
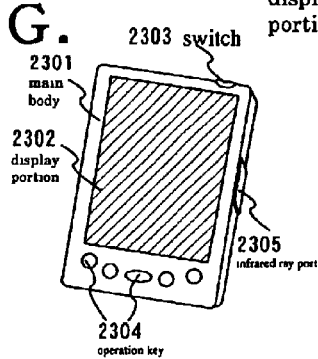

FIG. 14D illustrated a mobile computer which includes a main body 2301, a display portion 2302, a switch 2303, an operation key 2304, an infrared port 2305, and the like. The light emitting device of the present invention can be used as the display portion 2302.

Figure 14E:
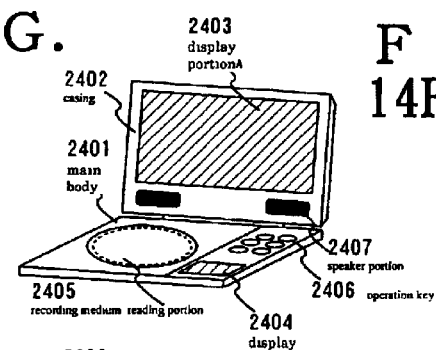

FIG. 14E illustrates a portable image reproduction apparatus including a recording medium (more specifically, a DVD reproduction apparatus), which includes a main body 2401, a casing 2402, a display portion A 2403, another display portion B 2404, a recording medium (DVD or the like) reading portion 2405, an operation key 2406, a speaker portion 2407 and the like. The display portion A 2403 is used mainly for displaying image information, while the display portion B 2404 is used mainly for displaying character information. The light emitting device of the present invention can be used as these display portions A 2403 and B 2404. The image reproduction apparatus including a recording medium further includes a game machine or the like.

Figure 14F:
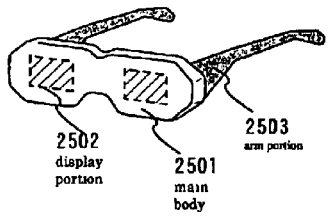

FIG. 14F illustrates a goggle type display (head mounted display) which includes a main body 2501, a display portion 2502, arm portion 2503, and the like. The light emitting device of the present invention can be used as the display portion 2502.

Figure 14G:
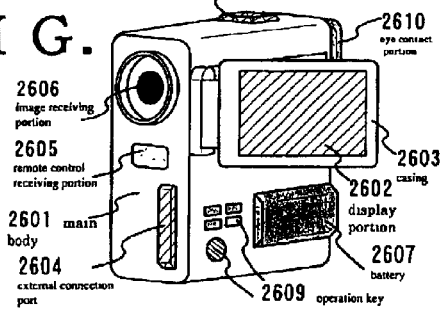

FIG. 14G illustrates a video camera which includes a main body 2601, a display portion 2602, a casing 2603, an external connecting port 2604, a remote control receiving portion 2605, an image receiving portion 2606, a battery 2607, a sound input portion 2608, an operation key 2609, and the like. The light emitting device of the present invention can be used as the display portion 2602.

Figure 14H:
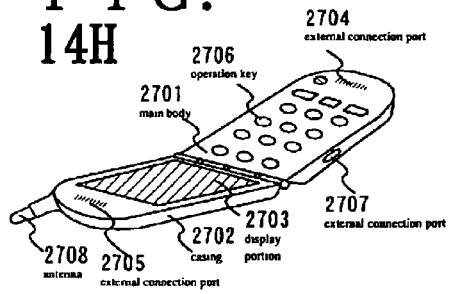

FIG. 14H illustrates a mobile telephone which includes a main body 2701, a casing 2702, a display portion 2703, a sound input portion 2704, a sound output portion 2705, an operation key 2706, an external connecting port 2707, an antenna 2708, and the like. The light emitting device of the present invention can be used as the display portion 2703. Note that the display portion 2703 can reduce power consumption of the mobile telephone by displaying white-colored characters on a black-colored background.

When the brighter luminance of light emitted from the organic light-emitting material becomes available in the future, the light emitting device in accordance with the present invention will be applicable to a front-type or rear-type projector in which light including output image information is enlarged by means of lenses or the like to be projected.

The aforementioned electronic devices are more likely to be used for display information distributed through a telecommunication path such as Internet, a CATV (cable television system), and in particular likely to display moving picture information. The light emitting device is suitable for displaying moving pictures since the organic light-emitting material can exhibit high response speed.

A portion of the light emitting device that is emitting light consumes power, so it is desirable to display information in such a manner that the light-emitting portion therein becomes as small as possible. Accordingly, when the light emitting device is applied to a display portion which mainly displays character information, e.g., a display portion of a portable information terminal, and more particular, a portable telephone or a sound reproduction device, it is desirable to drive the light emitting device so that the character information is formed by a light-emitting portion while a non-emission portion corresponds to the background.

As set forth above, the present invention can be applied variously to a wide range of electronic devices in all fields. The electronic device in this embodiment can be obtained by utilizing a light emitting device having the configuration in which the structures in Embodiments 1 through 8 are freely combined.

Also, the semiconductor device of the present invention can be applied to various types of semiconductor devices in addition to those described in the preferred embodiments.

The surface area of a switching element can be suppressed, and pixels can be given higher definition and higher functionality, by using the switching element of the present invention.

Further, even if the characteristics of the transistors Tr1 which control the electric current flowing in the OLEDs differ between pixels, the development of a difference between pixels in the size of the electric current flowing in the OLEDs can be prevented, and brightness irregularities can be suppressed by the light emitting device of the present invention which uses the switching element. Further, the surface area of the pixel circuits is made smaller, and as a result, the aperture ratio increases, the device can be made to have low power consumption, and the reliability of the light emitting device can be increased.

In addition, a constant brightness can be obtained, without being influenced by temperature changes, with the light emitting device of the present invention which uses the switching element. Further, even for cases of forming OLEDs having organic light emitting materials that differ by color when performing color display, the brightness of each color of OLED can be prevented from varying in a inconsistent manner due to temperature, and a desired color can be obtained.

What is claimed is:

1. A light emitting device comprising:

a switching element;

a first transistor;

a second transistor;

an organic light emitting element;

a signal line;

an electric power source line;

wherein:

the switching element has: an active layer; a gate insulating film contacting the active layer; and a gate electrode contacting the gate insulating film;

the active layer has a channel forming region and three impurity regions;

the channel forming region and the gate electrode overlap with each other while sandwiching the gate insulating film therebetween;

the three impurity regions contact the channel forming region;

the first transistor has a gate electrode, a drain region, and a source region;

among the three impurity regions: one impurity region is connected to the signal line; one impurity region is connected to the gate electrode of the first transistor; and one impurity region is connected to the drain region of the first transistor;

the second transistor has a source region and a drain region;

one of the source region and the drain of the second transistor is connected to the electric power source line, and the other is connected to the drain region of the first transistor;

the organic light emitting element has a pixel electrode; and the source region of the first transistor is connected to the pixel electrode of the organic light emitting element.

2. A light emitting device comprising:

a switching element;

a first transistor;

a second transistor;

an organic light emitting element;

a signal line;

an electric power source line;

a first scanning line; and a second scanning line, wherein:

the switching element has: an active layer; a gate insulating film contacting the active layer; and a gate electrode contacting the gate insulating film;

the active layer has a channel forming region and three impurity regions;

the channel forming region and the gate electrode overlap with each other while sandwiching the gate insulating film therebetween;

the three impurity regions contact the channel forming region;

the first transistor has a gate electrode, a drain region, and a source region;

among the three impurity regions: one impurity region is connected to the signal line; one impurity region is connected to a gate electrode of the first transistor; and one impurity region is connected to a drain region of the first transistor;

the gate electrode of the switching element is connected to the first scanning line;

the gate electrode of the second transistor is connected to the second scanning line;

the second transistor has a source region and a drain region;

the source region or the drain region of the second transistor is connected to the electric power source line, and the other is connected to the drain region of the first transistor;

the organic light emitting element has a pixel electrode; and the source region of the first transistor is connected to the pixel electrode of the organic light emitting element.

* * * * *